United States Patent
Cheng et al.

(10) Patent No.: US 7,491,994 B2
(45) Date of Patent: Feb. 17, 2009

(54) FERROMAGNETIC MEMORY CELL AND METHODS OF MAKING AND USING THE SAME

(75) Inventors: Kangguo Cheng, Beacon, NY (US); Herbert Lei Ho, New Windsor, NY (US); Louis Lu-Chen Hsu, Fishkill, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 570 days.

(21) Appl. No.: 11/216,387

(22) Filed: Aug. 31, 2005

(65) Prior Publication Data

US 2007/0045686 A1  Mar. 1, 2007

(51) Int. Cl.
*H01L 29/94* (2006.01)

(52) U.S. Cl. .......................... 257/295; 438/3

(58) Field of Classification Search .......... 257/295; 438/3
See application file for complete search history.

(56) References Cited

U.S. PATENT DOCUMENTS

| 5,068,826 A | 11/1991 | Matthews |
| 5,329,480 A | 7/1994 | Wu et al. |
| 5,389,566 A * | 2/1995 | Lage .............................. 438/3 |
| 6,064,083 A | 5/2000 | Johnson |
| 6,768,150 B1 * | 7/2004 | Low et al. .................... 257/295 |

* cited by examiner

*Primary Examiner*—Roy K Potter
(74) *Attorney, Agent, or Firm*—Roy W. Truelson

(57) ABSTRACT

In a first aspect, a first apparatus is provided. The first apparatus is a memory cell that includes (1) a semiconductor fin enclosure formed on an insulating layer of a substrate; and (2) a ferromagnetic material within the semiconductor fin enclosure. A top surface of the ferromagnetic material is below a top surface of the semiconductor fin enclosure. Numerous other aspects are provided.

20 Claims, 21 Drawing Sheets

FERROMAGNETIC MEMORY CELL AND METHODS OF MAKING AND USING THE SAME

FIELD OF THE INVENTION

The present invention relates generally to memory, and more particularly a ferromagnetic memory cell and methods of making and using the same.

BACKGROUND

One type of high density memory is formed from ferromagnetic memory cells. Features of conventional ferromagnetic memory cells typically are defined using photolithography. Because of the small feature size used in such memory cells, ensuring accurate alignment of photolithographically defined features is difficult. Accordingly, improved methods of forming such memory cells are desirable.

SUMMARY OF THE INVENTION

In a first aspect of the invention, a first apparatus is provided. The first apparatus is a memory cell that includes (1) a semiconductor fin enclosure formed on an insulating layer of a substrate; and (2) a ferromagnetic material within the semiconductor fin enclosure. A top surface of the ferromagnetic material is below a top surface of the semiconductor fin enclosure.

In a second aspect of the invention, a first method is provided. The first method includes the steps of (1) forming a semiconductor fin enclosure on an insulating layer of a substrate; and (2) forming a ferromagnetic material within the semiconductor fin enclosure, thereby forming a memory cell. A top surface of the ferromagnetic material is below a top surface of the semiconductor fin enclosure.

In a third aspect of the invention, a first system is provided. The first system includes (1) a first memory cell; (2) a second memory cell coupled to the first memory cell in the same row as the first memory cell; and (3) a third memory cell coupled to the first memory cell in the same column as the first memory cell. Each cell includes (a) a semiconductor fin enclosure formed on an insulating layer of a substrate; and (b) a ferromagnetic material within the semiconductor fin enclosure. A top surface of the ferromagnetic material is below a top surface of the semiconductor fin enclosure. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides an improved ferromagnetic memory cell and methods of making and using the same. One or more features of ferromagnetic memory cells in accordance with an embodiment of the present invention may be defined without photolithography. Further, one feature of the improved ferromagnetic memory cell may be employed to align another feature of the cell. Additionally, the ferromagnetic cell may include a semiconductor fin of a width (e.g., a sub-minimum ground rule width) that enhances a current density of the fin, thereby a voltage across the cell caused by the Hall effect. Further, a ferromagnetic memory cell in accordance with the present invention may avoid problems (e.g., scalability problems) with conventional memory cells caused by low storage capacitance, increased leakage affecting data retention, Vt mismatch, etc.

FIGS. 1-12C illustrate a first exemplary method of forming a ferromagnetic memory cell 100 in accordance with an embodiment of the present invention and FIGS. 13A-18B illustrates a write operation and/or a read operation performed on the ferromagnetic memory cell in accordance with an embodiment of the present invention. In FIGS. 1A to 11A, 13A, 16A and 18A cross-sectional side views are taken along cut lines 1B-1B to 11B-11B, 13B-13B, 16B-16B and 18B-18B, respectively. In FIG. 12A, the first cross-sectional side view is taken along cut line 12B-12B and the second cross-sectional side view is taken along cut line 12C-12C.

Figure 1A:
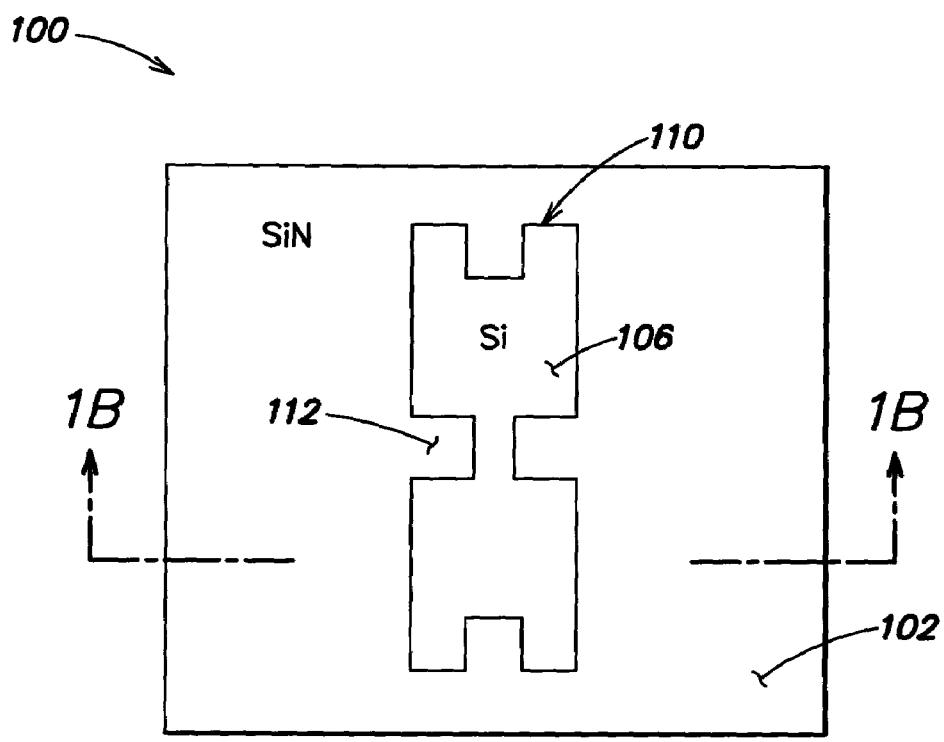
FIGS. 1A-B illustrate respective top and cross-sectional side views of a step of an exemplary method of forming a ferromagnetic memory cell in which nitride is etched in accordance with an embodiment of the present invention.
Figure 1B:
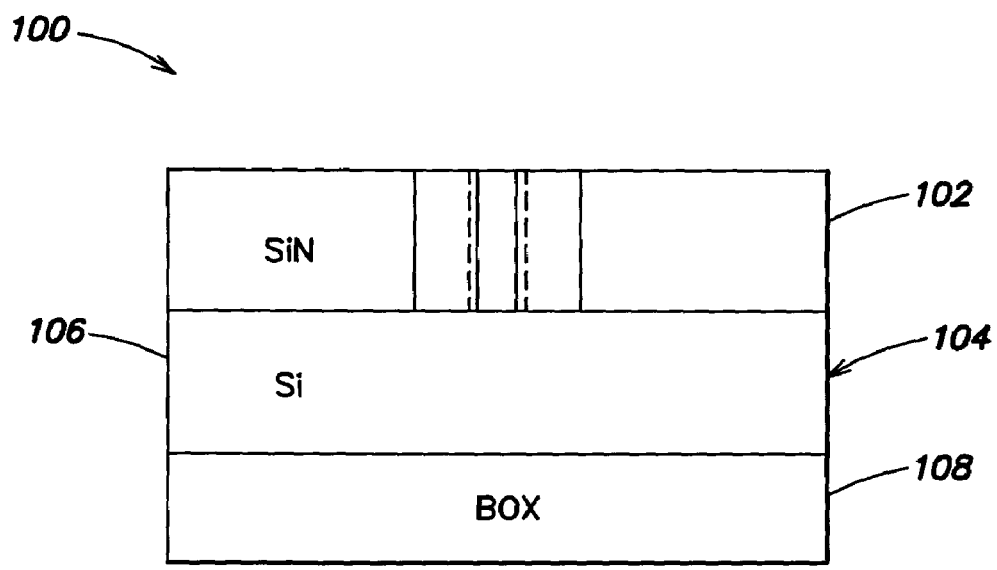

FIGS. 1A-B illustrate respective top view and cross-sectional side views of a step of an exemplary method of forming a ferromagnetic memory cell 100 in which nitride is etched in accordance with an embodiment of the present invention. With reference to FIGS. 1A-B, a nitride layer 102 may be formed on a silicon-on-insulator (SOI) substrate. For example, the SOI substrate 104 may include a silicon layer 106 deposited on an oxide layer 108 (e.g., a buried oxide (BOX) layer). The silicon layer 106 may be about 20 nm to about 500 nm thick (although a larger or smaller and/or different thickness range may be employed). Although a silicon-on-insulator (SOI) substrate is described above, another semiconductor, such as a group IV semiconductor (e.g., germanium (Ge), silicon germanium (SiGe), silicon carbide (SiC), etc.) or a group III-V semiconductor (e.g., gallium arsenide (GaAs), indium phosphide (InP), indium gallium phosphide (InGaP), indium arsenide (InAs), aluminum gallium arsenide (AlGaAS), gallium nitride (GaN), gallium indium arsenide (GaInAs), GaSb, AlSb, AlGaSb, etc.) on insulator may be employed. Composite layers of the above mentioned semiconductor materials may also be formed on insulator. The semiconductor material employed by the present methods and apparatus may be doped (e.g., heavily) with either n or p-type impurities.

Chemical vapor deposition (CVD) or another suitable method may be employed to deposit a layer 102 of nitride (e.g., silicon nitride) on the substrate 104. The nitride layer 102 may be about 50 nm to 5000 nm thick (although a larger or smaller and/or different thickness range may be employed). In some embodiments, thermal oxidation, CVD, physical vapor deposition (PVD) or another suitable method may be employed to deposit a layer of pad oxide (not shown) on the substrate 104 before depositing the nitride layer 102. In such embodiments, the pad oxide layer may be about 1 nm to about 20 nm thick (although a larger or smaller and/or different thickness range may be employed).

Thereafter, anisotropic etching or another suitable method may be employed to remove one or more portions of the nitride layer 102 stopping at a surface of the silicon layer 106, thereby forming a pattern 110, which may include one or more cut out regions 112 (e.g., tabs), in the nitride layer 102. In this manner, a shape of the pattern, may be photolithographically defined. Additional features of the memory cell 100 subsequently formed without photolithography may align themselves to the pattern 110. In this manner such features are self-aligning.

Figure 2A:
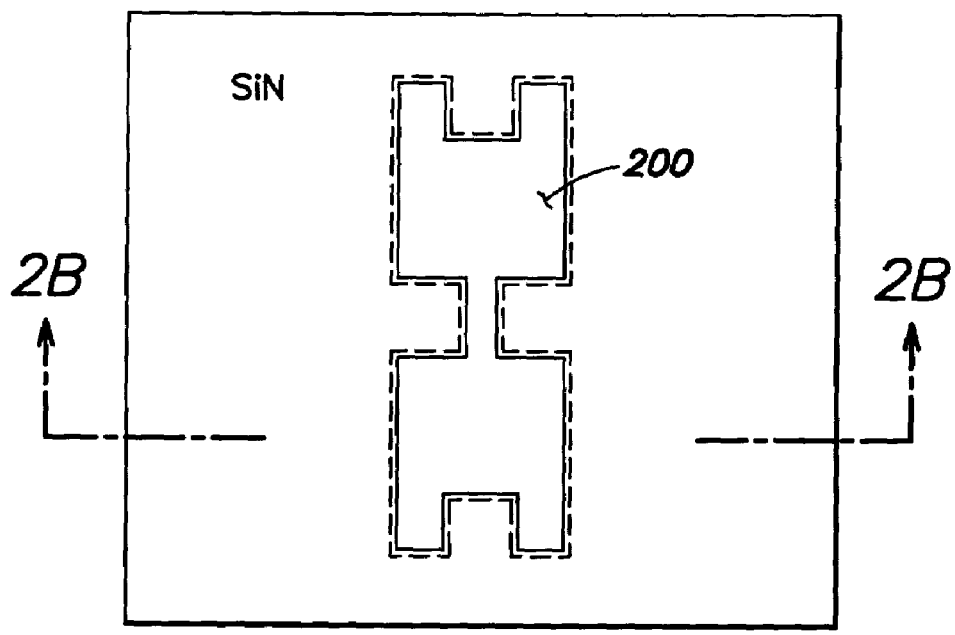
FIGS. 2A-B illustrate respective top and cross-sectional side views of a step of an exemplary method of forming a ferromagnetic memory cell in which silicon is etched in accordance with an embodiment of the present invention.
Figure 2B:
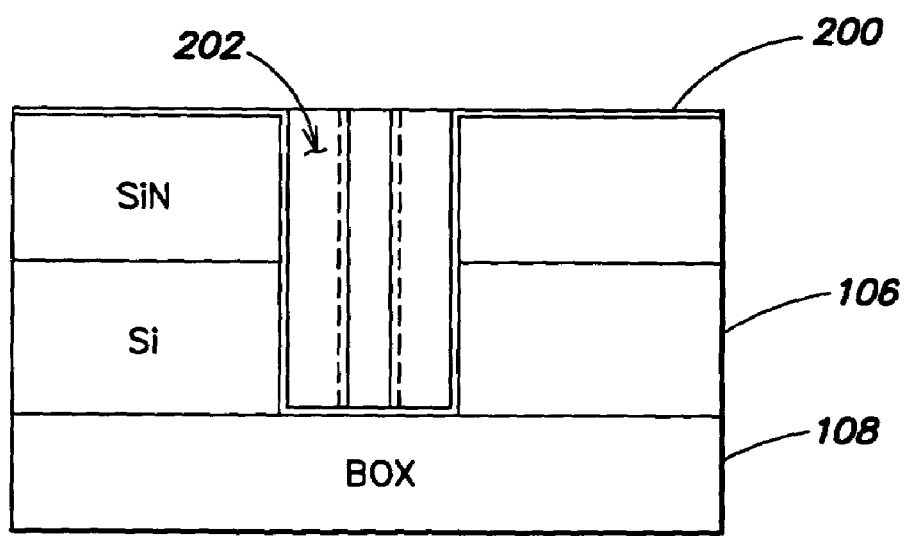

FIGS. 2A-B illustrate respective top and cross-sectional side views of a step of an exemplary method of forming a ferromagnetic memory cell in which silicon is etched in accordance with an embodiment of the present invention. With reference to FIGS. 2A-B, reactive ion etching (RIE) or another suitable method may be employed to remove portions of the silicon layer 106 exposed by the pattern 110 stopping at the BOX layer 108. CVD or another suitable method may be employed to deposit (e.g., conformally) a thin nitride layer 200. The nitride layer 200 may be about 5 nm to about 50 nm thick (although a larger or smaller and/or different thickness range may be employed). The thin nitride layer 200 may serve as an insulating layer between a subsequently-formed semiconductor fin enclosure and subsequently-deposited ferromagnetic material. In this manner, a recess 202 may be formed.

Figure 3A:
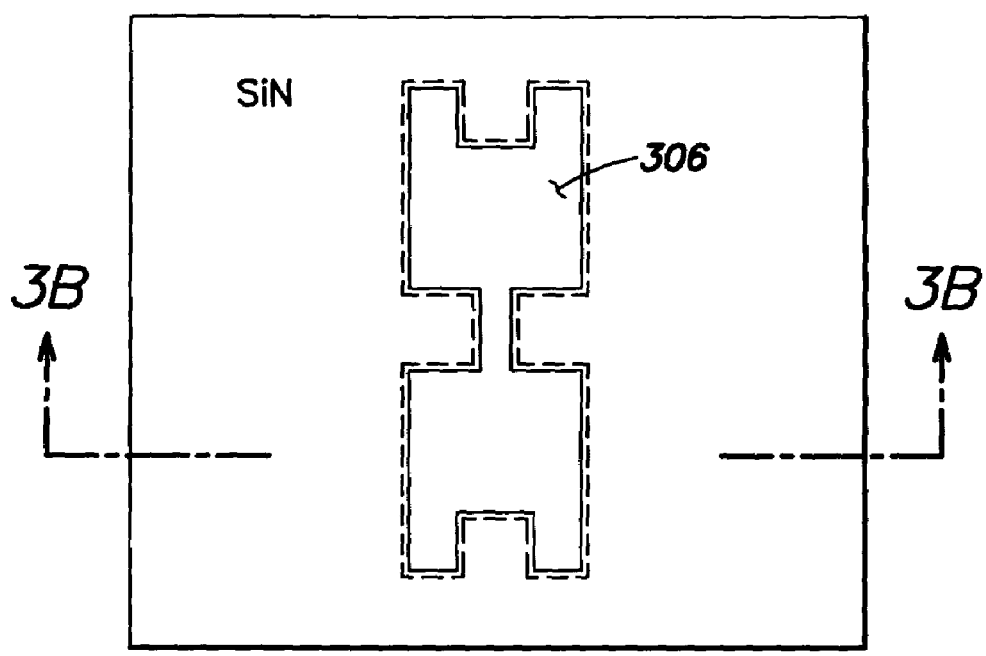
FIGS. 3A-B illustrate respective top and cross-sectional side views of a step of an exemplary method of forming a ferromagnetic memory cell in which a ferromagnetic material is deposited, recessed and an oxide cap is formed thereon in accordance with an embodiment of the present invention.
Figure 3B:
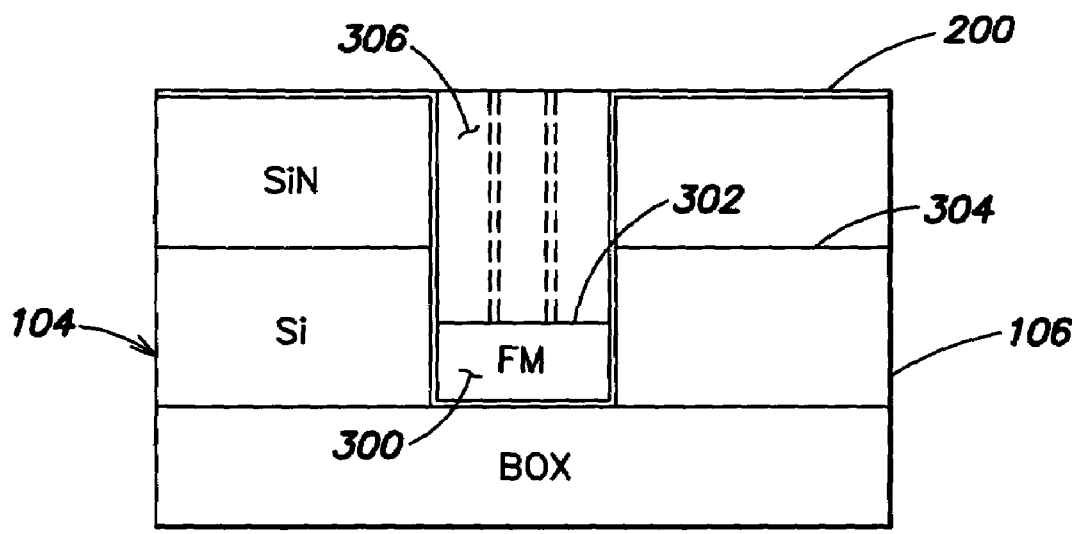

FIGS. 3A-B illustrate respective top and cross-sectional side views of a step of an exemplary method of forming a ferromagnetic memory cell in which a ferromagnetic material is deposited, recessed and an oxide cap is formed thereon in accordance with an embodiment of the present invention. With reference to FIGS. 3A-B, RF sputtering, DC sputtering, e-beam evaporation and/or another suitable method may be employed to deposit a layer 300 of ferromagnetic material such that the ferromagnetic layer 300 fills the recess (202 in FIG. 2). Chemical mechanical planarization (CMP) or another suitable method may be employed to planarize the ferromagnetic layer 300 to a top surface of the nitride layer 200. The ferromagnetic layer 300 may comprise cobalt (Co), iron (Fe), $FeOFe_2O_3$, $NiOFe_2O_3$, $CuOFe_2O_3$, $MgOFe_2O_3$, CoCr, CoFe, nickel (Ni), NiFe or CoPt (although the ferromagnetic layer 300 may comprise one or more different and/or additional suitable ferromagnetic materials).

In some embodiments, PVD or another suitable method may be employed to deposit a thin layer of PtMn (not shown) or another suitable material before the ferromagnetic layer 300 is deposited. The thin layer of PtMn may promote adhesion.

Thereafter, RIE or another suitable method may be employed to remove portions of the ferromagnetic layer 300. In this manner, the ferromagnetic layer 300 may be recessed such that a top surface 302 of the ferromagnetic layer 300 is below a top surface 304 of the silicon layer 106 by an amount approximately equal to half the thickness of the silicon layer 106, thereby forming a recess (although the ferromagnetic layer 300 may be recessed deeper or shallower).

CVD or another suitable technique may be employed to deposit an oxide layer 306 (e.g., by using a Tetraethylorthosilicate (TEOS) precursor, by using a high-density plasma (HDP) deposition, etc.) on the substrate 104. CMP or another suitable method may be employed to planarize the oxide layer 306 to a top surface of the nitride layer 200, thereby forming the oxide cap.

The substrate 104 may undergo annealing or another suitable process to crystallize the material in the ferromagnetic layer 300, thereby inducing hard magnetic properties. Annealing may be performed at a temperature of about 600° C. to 900° C. for about 10 s to about 15 min. However, annealing may be performed at a larger or smaller and/or different temperature range. Additionally or alternatively, annealing may be performed for a larger or smaller and/or different time period depending on the type of material(s) comprising the ferromagnetic layer 300 and desired magnetic properties of such layer 300.

Figure 4A:
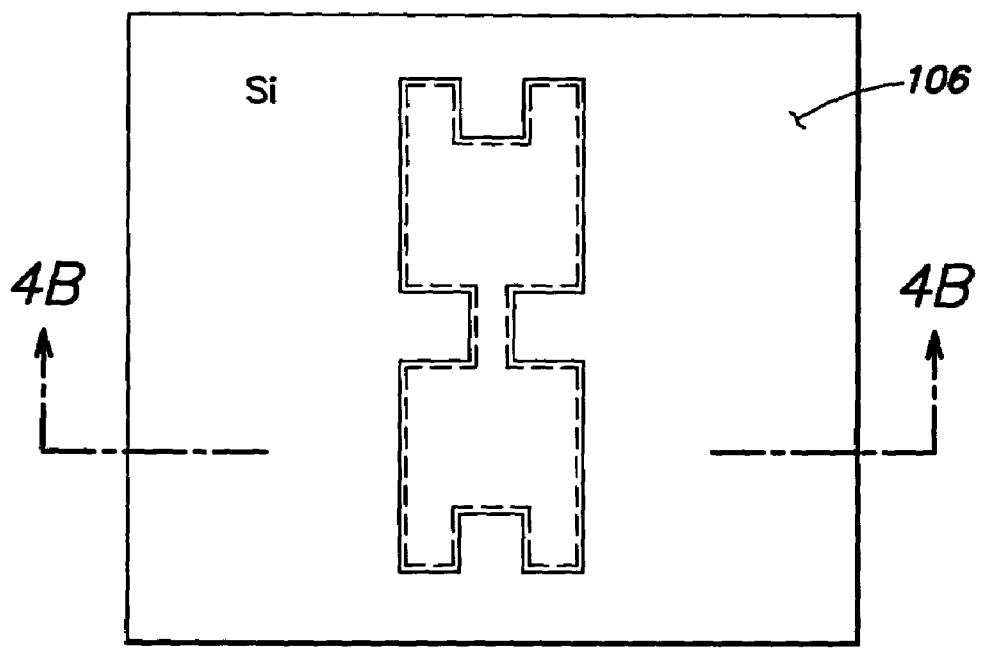
FIGS. 4A-B illustrate respective top and cross-sectional side views of a step of an exemplary method of forming a ferromagnetic memory cell in which nitride is etched in accordance with an embodiment of the present invention.
Figure 4B:
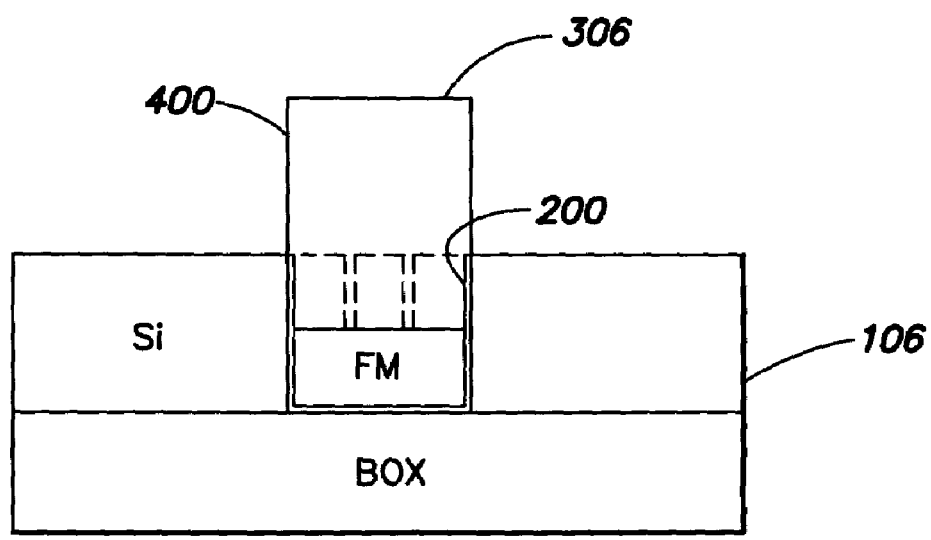

FIGS. 4A-B illustrate respective top and cross-sectional side views of a step of an exemplary method of forming a ferromagnetic memory cell in which nitride is etched in accordance with an embodiment of the present invention. With reference to FIGS. 4A-B, RIE (e.g., with carbontetrafluoride ($CF_4$) chemistry, isotropic etching (e.g., wet hot phosphoric acid or dry chemical etch) and/or another suitable method may be employed to remove nitride layers 102, 200 stopping at a surface of the silicon layer 106. The nitride layers 102, 200 may be removed selective to oxide and silicon. In this manner, a sidewall 400 of the oxide layer 306 may be exposed.

Figure 5A:
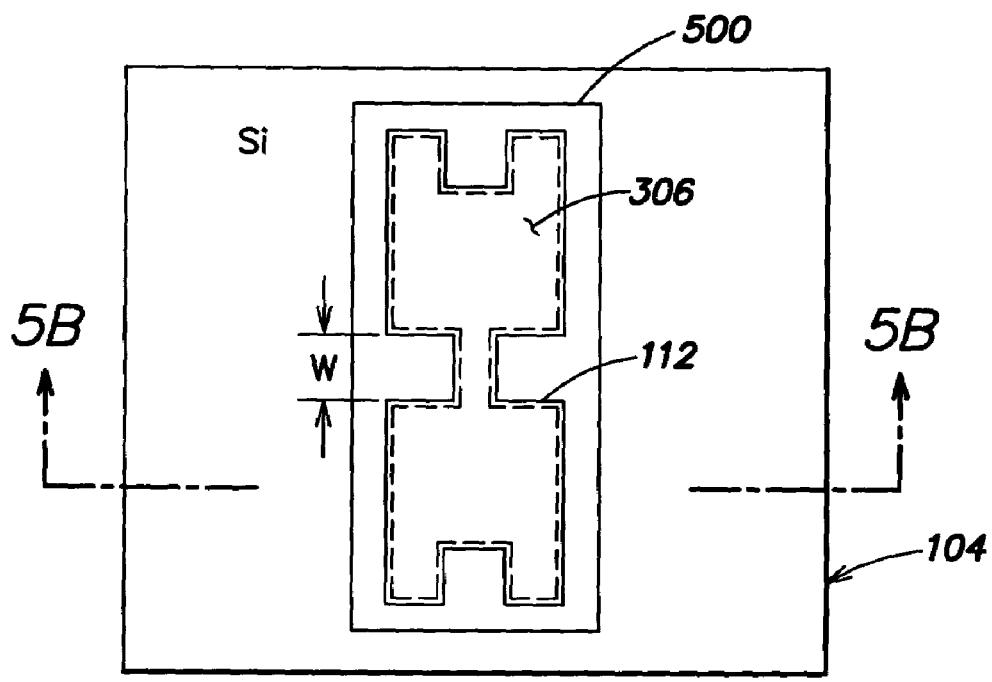
FIGS. 5A-B illustrate respective top and cross-sectional side views of a step of an exemplary method of forming a ferromagnetic memory cell in which oxide spacers are formed in accordance with an embodiment of the present invention.
Figure 5B:
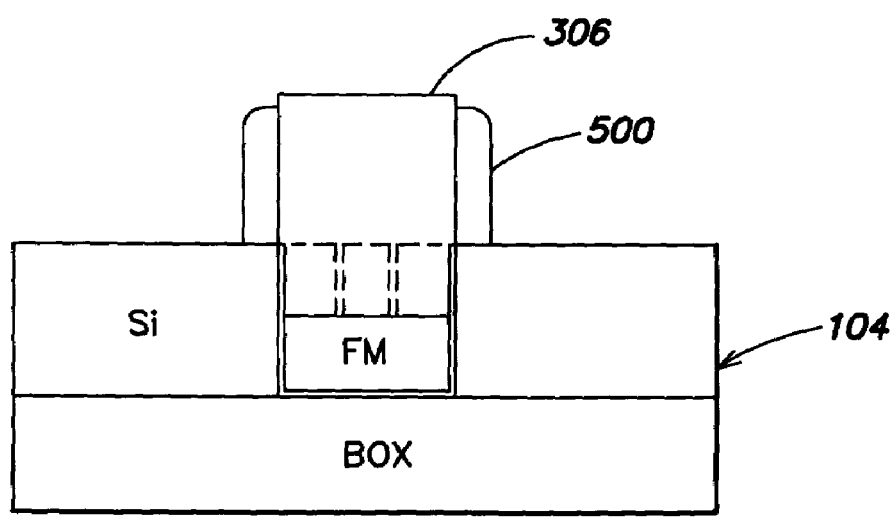

FIGS. 5A-B illustrate respective top and cross-sectional side views of a step of an exemplary method of forming a ferromagnetic memory cell in which oxide spacers are formed in accordance with an embodiment of the present invention. With reference to FIGS. 5A-B, CVD or another method may be employed to deposit (e.g., conformally) a layer of oxide on the substrate 104. Thereafter, RIE or another suitable method may be employed to remove portions of such oxide layer selective to silicon. In this manner, one or more oxide spacers 500 may be formed on corresponding sidewalls 400 (e.g., vertical sidewalls) of the oxide layer 306 (e.g., the CVD oxide region) that serve to form an apron surrounding the oxide layer 306. In the cutout regions (e.g., tabs) 112 the oxide spacers 500 may be confined, and therefore, opposing oxide spacers 500 merge to form a continuous oxide region. The oxide spacers 500 in the cutout regions 112 may subsequently serve as contact landing regions.

In some embodiments, a thin nitride (e.g., silicon nitride) layer (not shown) may be conformally deposited over the substrate 104 before the oxide spacers 500 are formed. The thin nitride layer may serve to prevent excessive erosion of the oxide layer 306 (e.g., the oxide cap) during RIE to form the oxide spacers 500. In some embodiments, the oxide spacers 500 may be about 5 nm to about 50 nm wide (although a larger or smaller and/or different width range may be employed). In some embodiments, to ensure the oxide spacers 500 merge together in the cut out regions 112 (e.g., tabs), the thickness of the deposited oxide layer employed to form the oxide spacers 500, which serves as the width of the oxide spacers 500, may be at least half a width w of the cutout region (e.g., tab) 112. The width of the oxide spacer 500 may determine a width of a subsequently-formed semiconductor (e.g., silicon) fin enclosure (described below with reference to FIG. 6B).

Figure 6A:
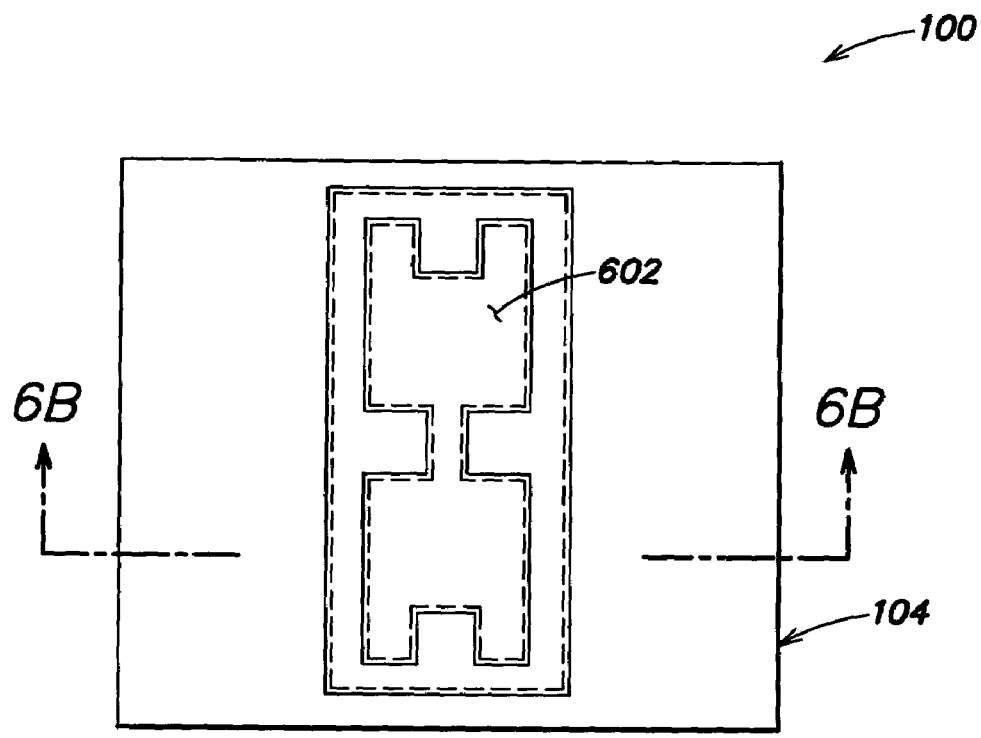
FIGS. 6A-B illustrate respective top and cross-sectional side views of a step of an exemplary method of forming a ferromagnetic memory cell in which silicon is etched in accordance with an embodiment of the present invention.
Figure 6B:
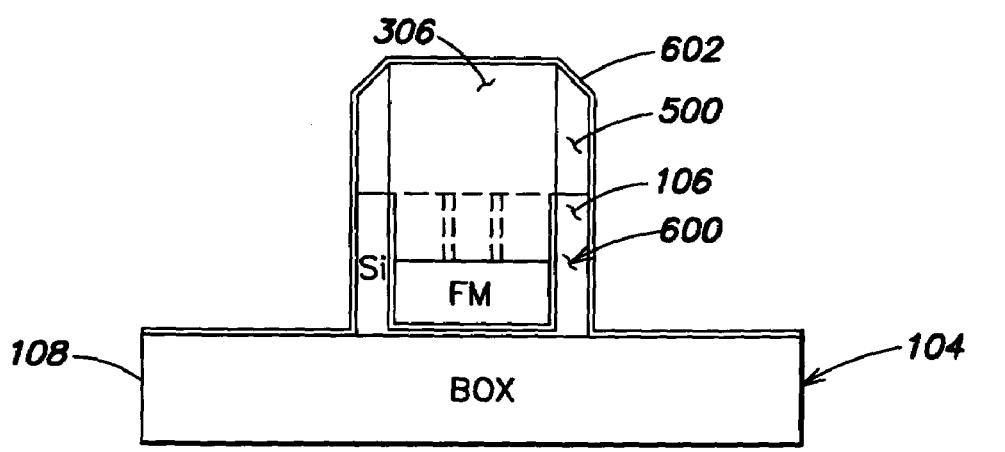

FIGS. 6A-B illustrate respective top and cross-sectional side views of a step of an exemplary method of forming a ferromagnetic memory cell in which silicon is etched in accordance with an embodiment of the present invention. With reference to FIGS. 6A-B, RIE or another suitable method may be employed to remove exposed portions of the silicon layer 106 selective to oxide (e.g., thereby stopping at the oxide (e.g., BOX) layer 108. During RIE, the oxide layer 306 and oxide spacers 500 may serve as a mask. Consequently, a semiconductor fin enclosure (e.g., loop) 600 may be formed. More specifically, a continuous rectangular semiconductor fin enclosure 600 interspersed with tabs (e.g., below the merged oxide spacers 500) (not shown) that may serve as subsequent contact regions. As described below, during operation, current may be provided through the semiconductor fin enclosure 600. Because the width of the oxide spacers 500 may determine the width of the semiconductor fin enclosure 600, the semiconductor fin enclosure 600 may be about 5 nm to about 50 nm wide (although a larger or smaller and/or different width range may be employed). The narrower the semiconductor fin enclosure, the higher a read current density in the fin enclosure, and therefore, the higher a Hall effect voltage for a given magnetic field may develop across the ferromagnetic memory cell 100.

CVD or another suitable method may be employed to deposit (e.g., conformally) a nitride layer 602 on the substrate 104. The nitride layer 602 may be about 5 nm to about 50 nm thick (although a larger or smaller and/or different thickness range may be employed). The nitride layer 602 may serve as an insulator between the semiconductor fin enclosure 600 and conductors (e.g., programming conductors) subsequently formed adjacent the semiconductor fin enclosure 600.

Figure 7A:
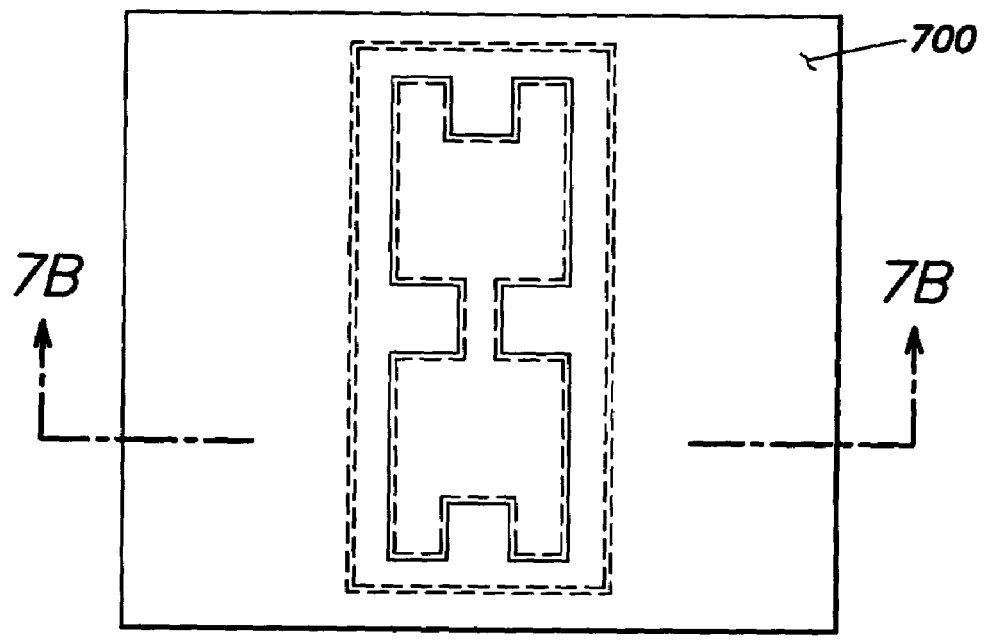
FIGS. 7A-B illustrate respective top and cross-sectional side views of a step of an exemplary method of forming a ferromagnetic memory cell in which tungsten is deposited in accordance with an embodiment of the present invention.
Figure 7B:
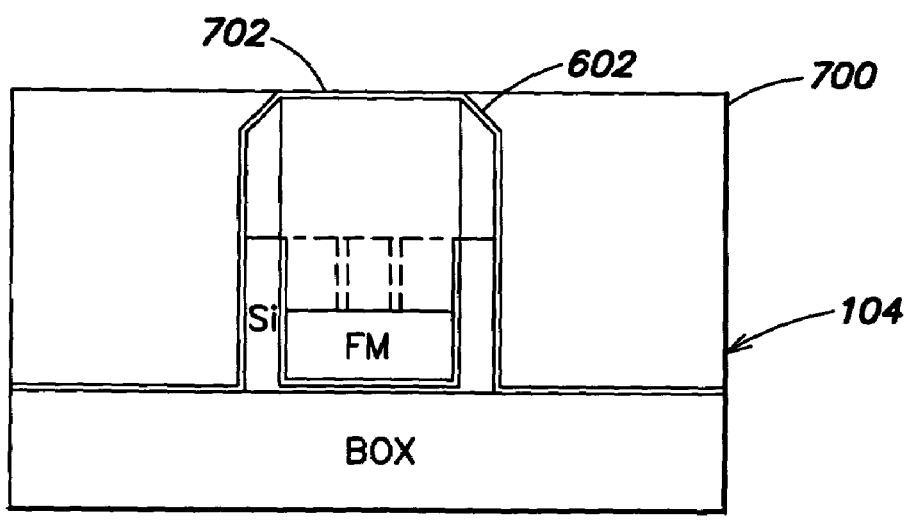

FIGS. 7A-B illustrate respective top and cross-sectional side views of a step of an exemplary method of forming a ferromagnetic memory cell in which tungsten is deposited in accordance with an embodiment of the present invention. With reference to FIGS. 7A-B, CVD, sputtering, e-beam evaporation and/or another suitable method may be employed to deposit a layer of tungsten 700 (or another suitable conductive material) on the substrate 104. CMP or another suitable method may be employed to planarize a top surface of the tungsten layer 700 approximately to a top surface 702 of the nitride layer 602. For example, the tungsten layer 700 may be planarized to a level slightly below the nitride layer 602 (although the tungsten layer 700 may be planarized deeper or shallower).

Figure 8A:
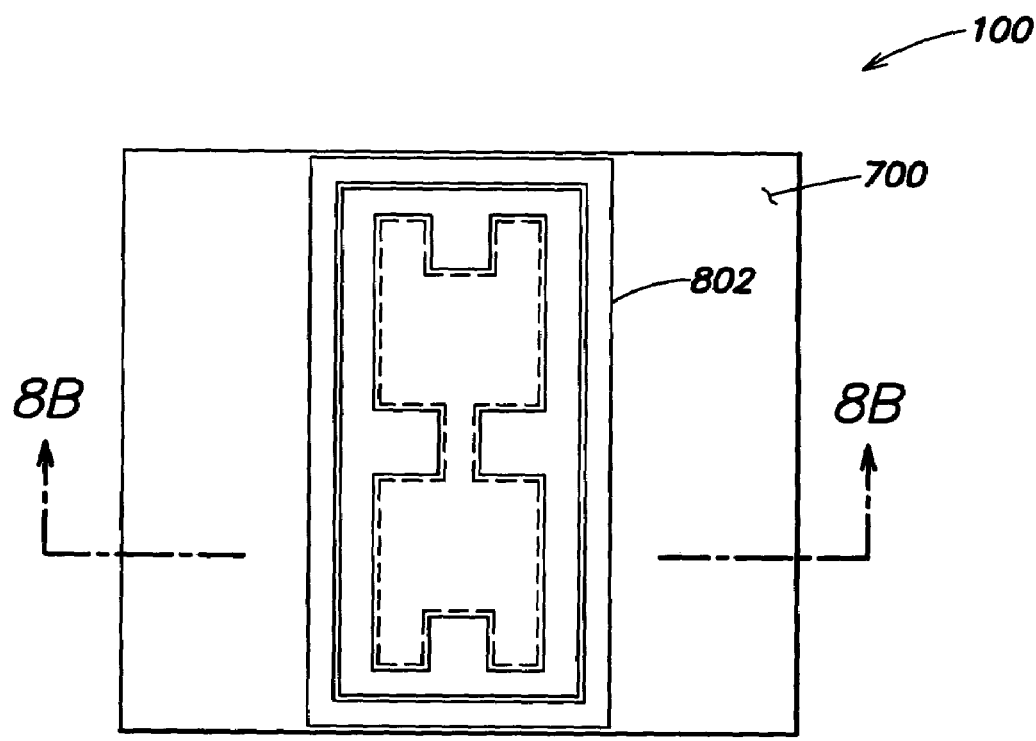
FIGS. 8A-B illustrate respective top and cross-sectional side views of a step of an exemplary method of forming a ferromagnetic memory cell in which the deposited tungsten is recessed to expose sidewalls and a nitride spacer is formed on the exposed sidewalls in accordance with an embodiment of the present invention.
Figure 8B:
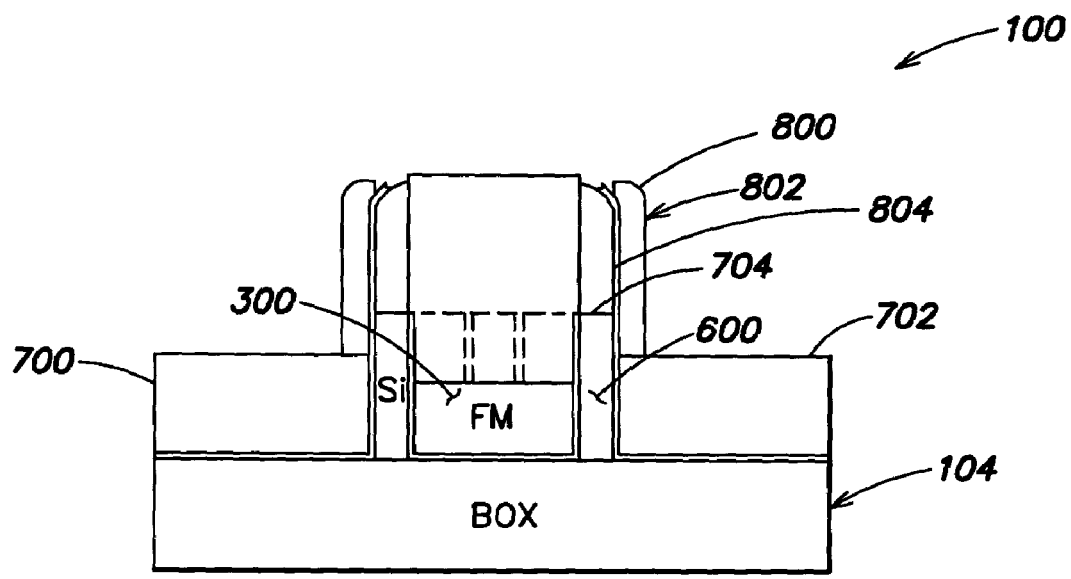

FIGS. 8A-B illustrate respective top and cross-sectional side views of a step of an exemplary method of forming a ferromagnetic memory cell in which the deposited tungsten is recessed to expose sidewalls and a nitride spacer is formed on the exposed sidewalls in accordance with an embodiment of the present invention. With reference to FIGS. 8A-B, RIE or another suitable method may be employed to remove one or more portions of the tungsten layer 700. For example, a top surface 702 of the tungsten layer 700 may be selectively recessed to a depth approximately level with or slightly below a top surface 704 of the silicon fin enclosure 600. In this manner, the top surface 702 of the recessed tungsten layer 700 may be above a top surface of the ferromagnetic layer 300. Consequently, a predominantly vertically-oriented magnetic field may be induced in the ferromagnetic layer 300 by current in the subsequently formed tungsten conductors on the outer sidewalls of the semiconductor fin during operation of the memory cell 100 (although the ferromagnetic layer 300 may be adapted to form a magnetic field with a different orientation).

CVD or another suitable method may be employed to deposit (e.g., conformally) a nitride (e.g., silicon nitride) layer 800 on the substrate 104. RIE or another suitable method may be employed to remove one or more portions of the nitride layer 800. In this manner, one or more nitride spacers 802 may be formed on sidewalls 804 exposed while recessing the tungsten layer 700. The nitride spacers 802 may surround a portion of the cell 100, and may serve as a mask when one or more portions of the tungsten layer 700 are subsequently removed (as described below). In some embodiments, the nitride spacers 802 may be about 10 nm to about 200 nm thick (although a larger or smaller and/or different thickness range may be employed). Further, in some embodiments, to facilitate subsequent etching selective to oxide, additional and/or different materials (e.g., polysilicon) may be employed to form the spacers 802.

Figure 9A:
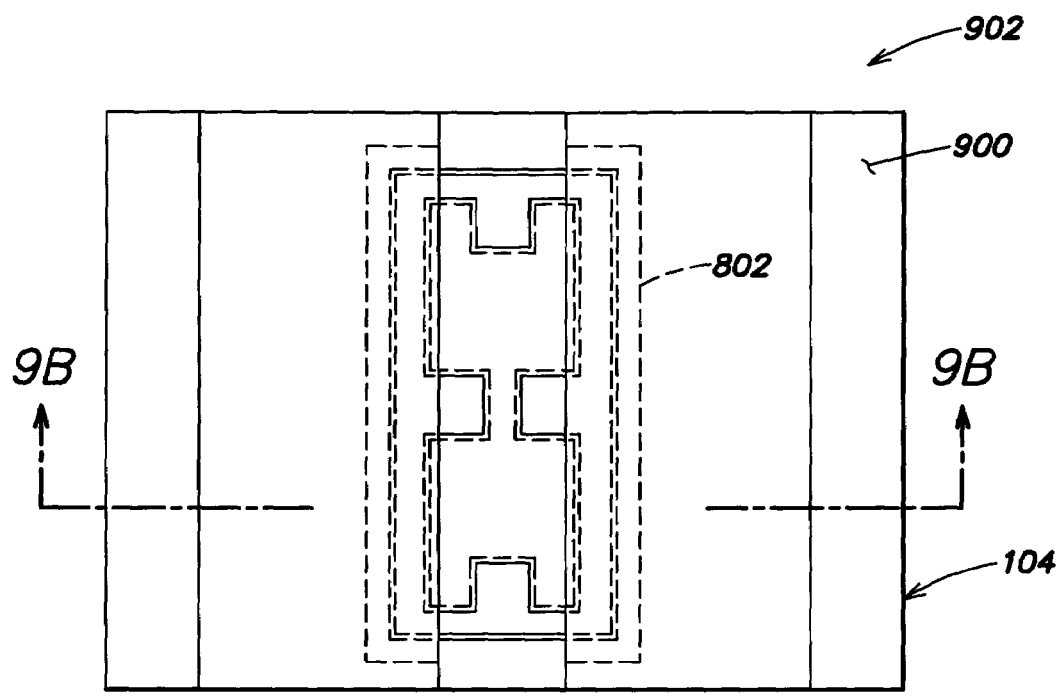
FIGS. 9A-B illustrate respective top and cross-sectional side views of a step of an exemplary method of forming a ferromagnetic memory cell in which a trim mask is employed to etch one or more portions of the nitride spacer in accordance with an embodiment of the present invention.
Figure 9B:
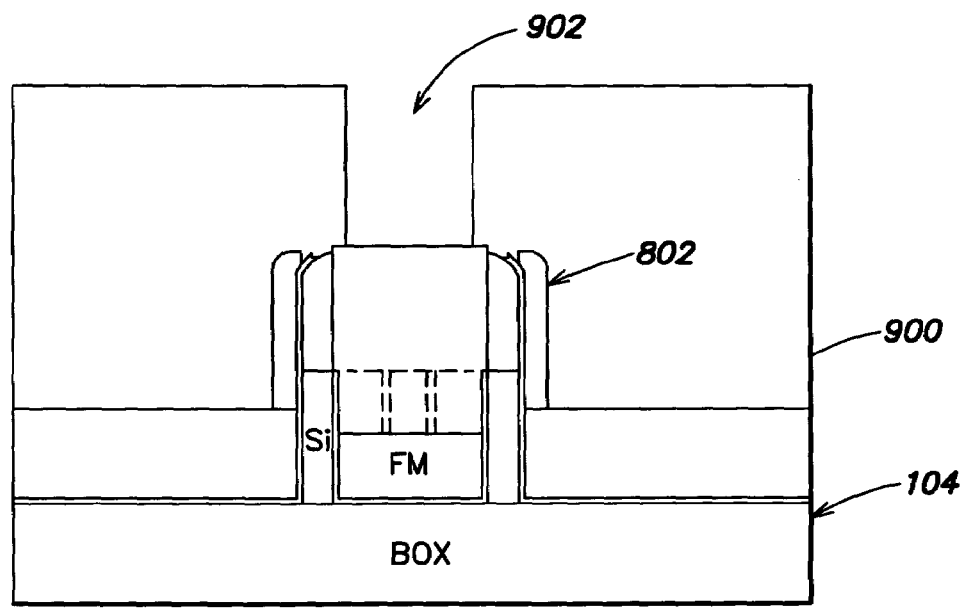

FIGS. 9A-B illustrate respective top and cross-sectional side views of a step of an exemplary method of forming a ferromagnetic memory cell in which a trim mask is employed to etch one or more portions of the nitride spacer in accordance with an embodiment of the present invention. With reference to FIGS. 9A-B, a spin-on technique or another suitable method may be employed to deposit a photoresist layer 900 on the substrate 104. Photolithography using the resist and appropriate masking or another suitable method may be employed to pattern the photoresist layer 900. In this manner, the photoresist layer 900 may serve as a trim mask adapted to expose a central region 902 of the substrate 104. For example, the photoresist layer 900 may serve as an etch mask while an isotropic nitride etch (e.g., using a hot phosphoric acid) or another suitable etching method is employed to remove exposed portions of the nitride spacer 802.

Figure 10A:
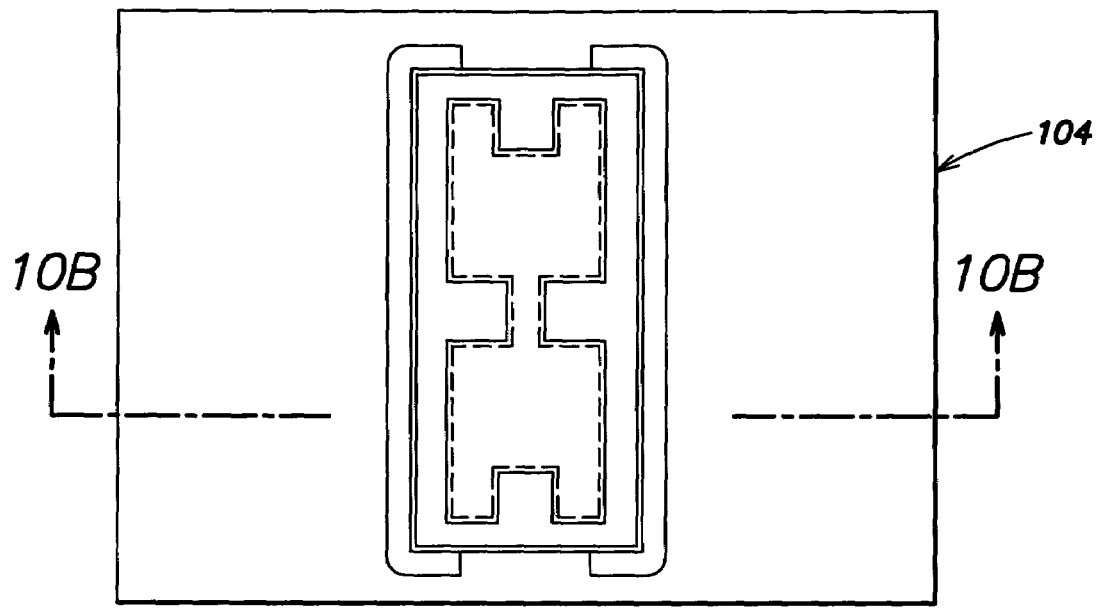
FIGS. 10A-B illustrate respective top and cross-sectional side views of a step of an exemplary method of forming a ferromagnetic memory cell in which tungsten is etched to form a first conductor on a first side of the semiconductor fin enclosure and a second conductor on a second side of the semiconductor fin enclosure in accordance with an embodiment of the present invention.
Figure 10B:
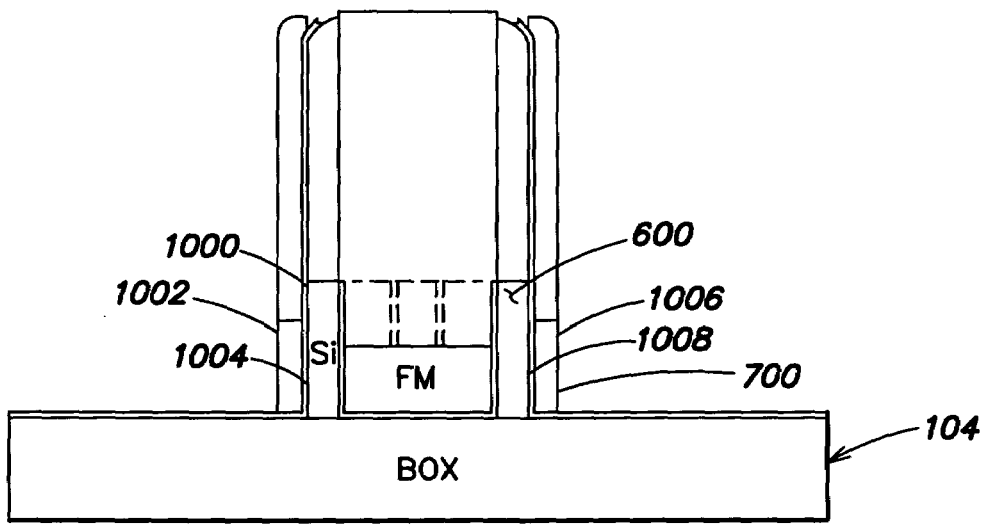

FIGS. 10A-B illustrate respective top and cross-sectional side views of a step of an exemplary method of forming a ferromagnetic memory cell in which tungsten is etched to form a first conductor on a first side of the semiconductor fin enclosure and a second conductor on a second side of the semiconductor fin enclosure in accordance with an embodiment of the present invention. With reference to FIGS. 10A-B, a photoresist stripper bath or another suitable method may be employed to strip the photoresist layer 900 from the substrate 104. Thereafter, RIE or another suitable method may be employed remove exposed portions of the tungsten layer 700. In this manner, one or more conductors (e.g., tungsten conductors) may be formed along the outer sidewalls 1000 of the semiconductor fin enclosure 600. For example, a first conductor 1002 may be formed along a first side 1004 of the semiconductor fin enclosure 600 and a second conductor 1006 may be formed along a second side 1008 of the semiconductor fin enclosure 600. The nitride layer 602 may serve to insulate the first and second conductors 1002, 1006 from the semiconductor fin enclosure 600. As described below, during operation, current may be provided through the first and second conductors 1002, 1006 thereby affecting a magnetic field orientation in the ferromagnetic layer 300 and writing data to the ferromagnetic memory cell 100.

Figure 11A:
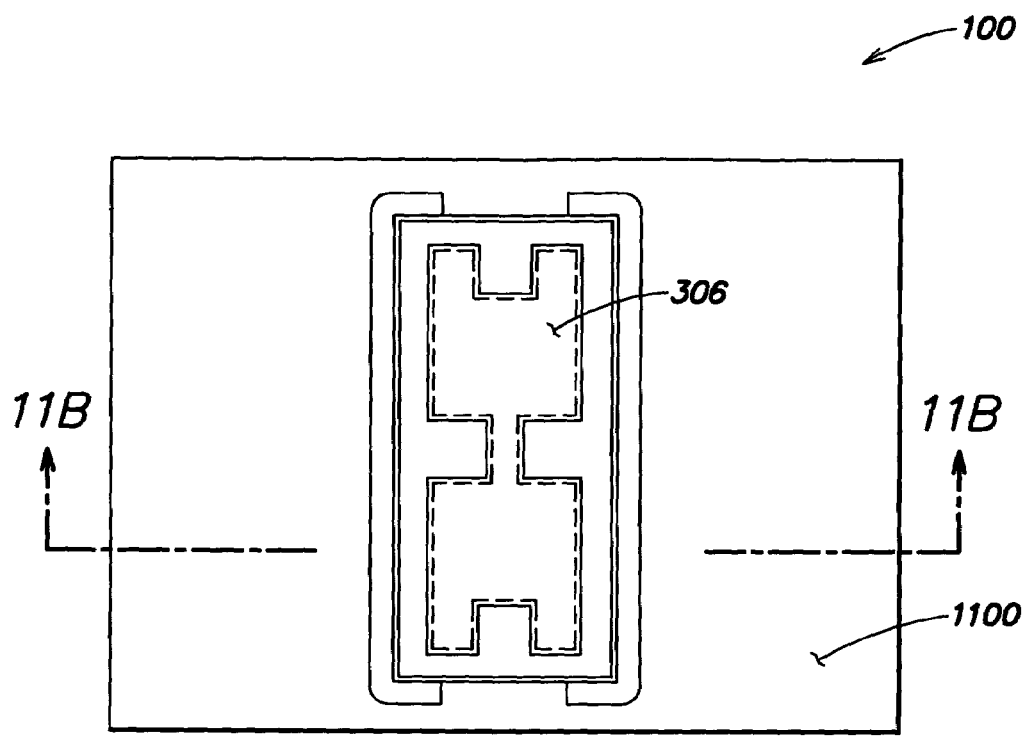
FIGS. 11A-B illustrate respective top and cross-sectional side views of a step of an exemplary method of forming a ferromagnetic memory cell in which oxide is deposited and planarized in accordance with an embodiment of the present invention.
Figure 11B:
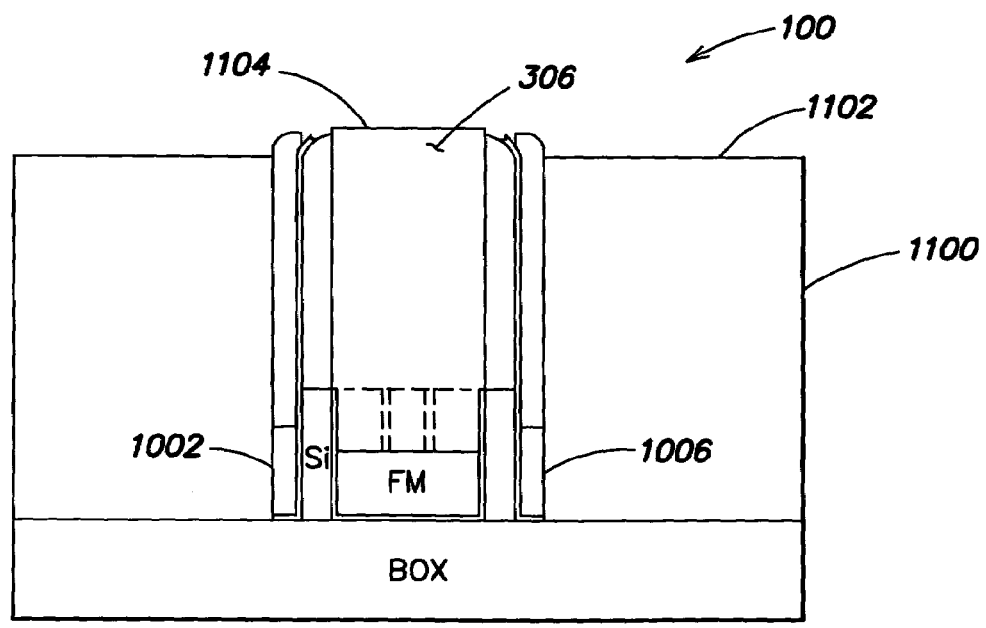
Figure 12A:
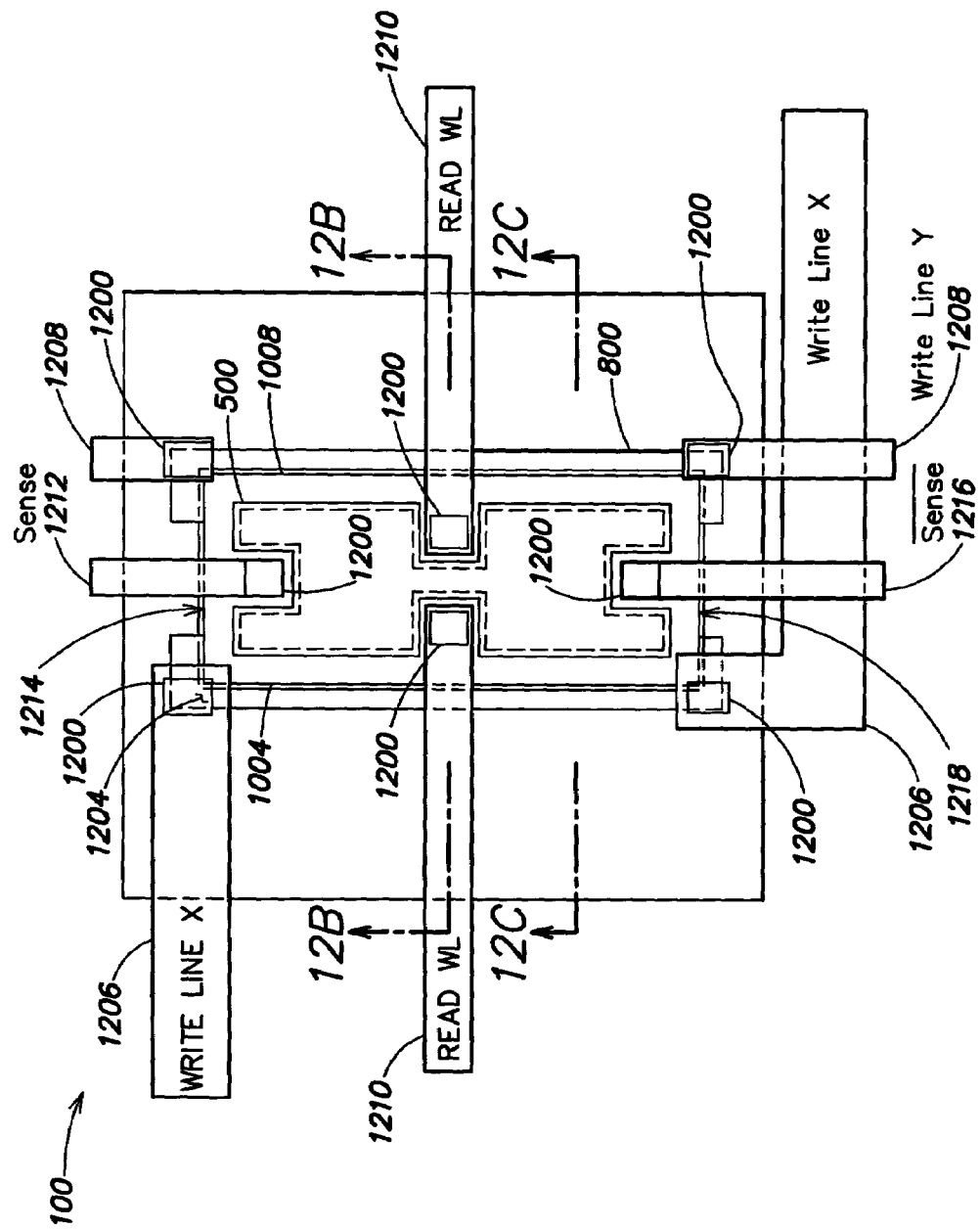
FIGS. 12A-C illustrate respective top, first cross-sectional side and second cross-sectional side views of a step of an exemplary method of forming a ferromagnetic memory cell in which one or more write word lines, read word lines and sense terminals are formed in accordance with an embodiment of the present invention.

FIGS. 11A-B illustrate respective top and cross-sectional side views of a step of an exemplary method of forming a ferromagnetic memory cell in which oxide is deposited and planarized in accordance with an embodiment of the present invention. With reference to FIGS. 11A-B, CVD or another suitable technique may be employed to deposit an oxide layer 1100 (e.g., by using a TEOS precursor, by using an HDP deposition, etc.) on the substrate 104. The oxide layer 1100 may be deposited with a thickness such that a top surface 1102 of the oxide layer 1100 is above a top surface 1104 of the oxide layer 306 (e.g., the CVD oxide region). However, the oxide layer 1100 may be deposited to a larger or smaller thickness.

Thereafter, CMP, anisotropic etching and/or another suitable method may be employed to planarize the oxide layer 1100 approximately to the top surface 1104 of the oxide layer 306. It should be noted that the oxide layer 1100 comprises freshly deposited undensified CVD oxide. Therefore, the oxide layer 1100 may be much softer than the existing (e.g., previously-deposited) oxide layer 306 (e.g., CVD oxide region), which has been cured by annealing. Consequently, the oxide layer 1100 may be planarized to a level approximately even with the top surface 1104 of the existing oxide layer 306 (e.g., CVD oxide region). Planarization and polishing continues until the top of the silicon nitride spacer 802 is exposed. Proper planarization depth is achieved by sensing the nitride signature. The planarization process is achieved preferably by a combination of CMP and anisotropic etch (although another suitable planarization method may be employed).

In some embodiments, CVD or another suitable material may be employed to deposit nitride layer (not shown) on the substrate 104 before depositing the oxide layer 1100. In such embodiments, the nitride layer may serve to prevent excessive erosion of the pre-existing oxide layer 306.

Figure 12B:
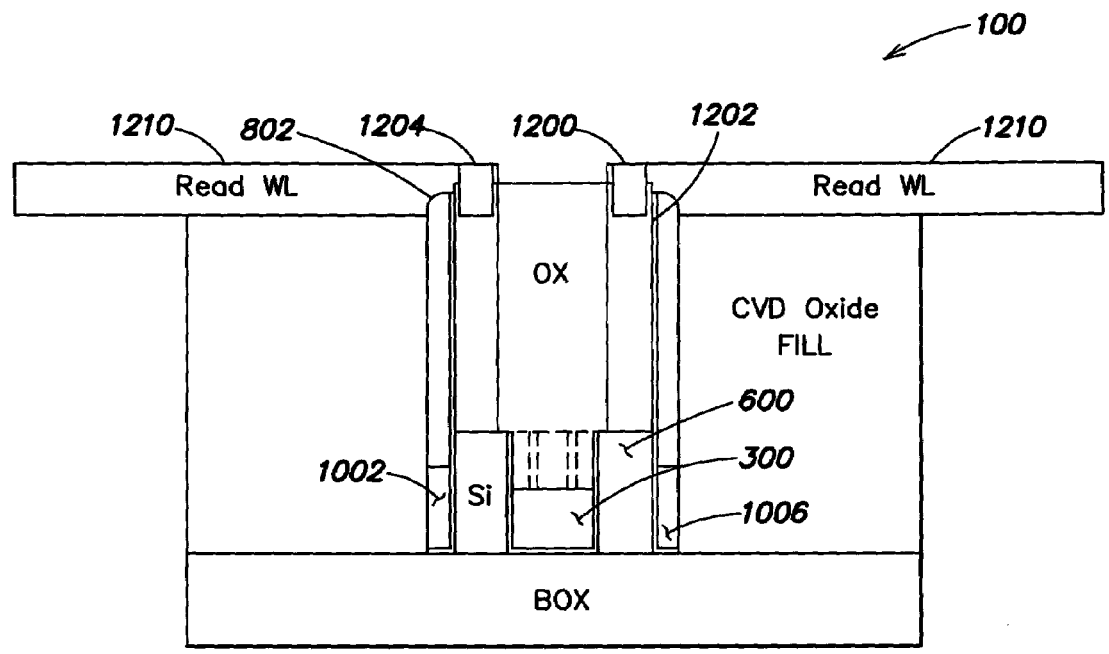
Figure 12C:
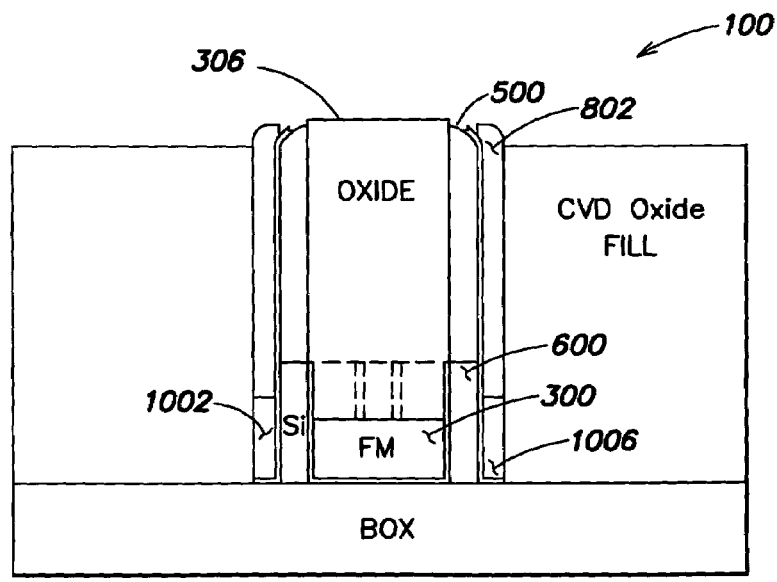

FIGS. 12A-C illustrate respective top, first cross-sectional side and second cross-sectional side views of a step of an exemplary method of forming a ferromagnetic memory cell in which one or more write word lines, read word lines and sense terminals are formed in accordance with an embodiment of the present invention. With reference to FIGS. 12A-C, RIE or another suitable method may be employed to form a contact opening or via 1200 through one or more portions of the nitride spacers 802 and through one or more portions of the oxide spacers 500. For example, one or more portions of the nitride spacers 802 may be removed selective to oxide stopping at a tungsten conductor 1002, 1006. A first contact mask may be formed and employed to form contact openings or vias 1200 to a tungsten conductor 1002, 1006 through the nitride spacers 802. Because the nitride is etched selective to oxide, the first contact mask may expose portions of oxide (e.g., the oxide spacers 500 and the oxide layer 306). In this manner, a contact opening or via 1200 to a conductor 1002, 1006 may align itself with the oxide (e.g., the oxide spacers 500). Thus, features of the memory cell 100 such as the contact opening or via 1200 are self-aligned. A second contact mask may be formed and employed to form contact openings or vias 1200 to the semiconductor fin enclosure 600 through the oxide spacers 500. One or more portions of the oxide spacers 500 may be removed selective to nitride stopping at the semiconductor fin enclosure 600. Misalignment of the second contact mask with the underlying fin enclosure, may result in etching a portion of oxide layer 306. This is of no concern, since the top surface of the fin enclosure 600 is above the top surfaces of the ferromagnetic material 300, and the tungsten conductors 1002, 1006 are covered by nitride spacers 802.

Once one or more contact openings or vias 1200 are formed to the conductors 1002, 1006, CVD or another suitable method may be employed to deposit (e.g., conformally) a nitride layer (not shown) therein. Thereafter, RIE or another suitable method may be employed to remove portions of such nitride layer. In this manner, a nitride spacer (not shown) lining the contact opening or via 1200 may be formed.

Thereafter, CVD or another suitable method may be employed to deposit conductive material (e.g., tungsten, doped polysilicon, or the like) into the contact openings or vias 1200. CMP or another suitable method may be employed to planarize the conductive material, thereby forming conductive studs 1202 in the contact openings or vias 1200. The nitride spacer lining a contact opening or via 1200 may serve to insulate the conductive stud 1202 formed therein from the adjacent semiconductor fin enclosure 600.

Thereafter, contacts 1204 may be formed to the conductive studs 1202. Wiring levels, including interlayer dielectrics may be defined (e.g., coupled to the contacts 1204). In this manner, wiring 1206 coupled to the first conductor 1002 may form a first write word line (write line x) and wiring 1208 coupled to the second conductor 1006 may form a second write word line (write line y). When a first current is provided to the first conductor 1002 by the first write word line and a second current is provided to the second conductor 1006 by the second word line, a magnetic field B (e.g., an orientation thereof) in the material of the ferromagnetic layer 300 may be affected (e.g., updated). In this manner, data may be written to the memory cell 100.

Similarly, wiring 1210 coupled to the first and second side 1004, 1008 of the semiconductor fin enclosure 600 may form a read word line (read wl). Wiring 1212 coupled to a third side 1214 of the semiconductor fin enclosure 600 may form a first read terminal sense and wiring 1216 coupled to a fourth side 1218 of the semiconductor fin enclosure 600 may form a second read terminal /sense. When a first current is provided to the semiconductor fin enclosure 600 by the read word line, a voltage develops across the first and second read terminals 1212, 1216. The voltage may indicate a value stored by the memory cell 100.

In this manner, one or more features of a ferromagnetic cell 100 in accordance with an embodiment of the present invention may be defined without photolithography. Further, one or more features of the ferromagnetic cell 100 may align themselves to other features of the cell 100.

The operation of the ferromagnetic memory cell 100 is now described with reference to FIGS. 13A-18B. For example, electrical operation of the ferromagnetic memory cell 100 such that data may be written to and/or read from the ferromagnetic memory cell 100 is now described.

Write "1"

Figure 13A:
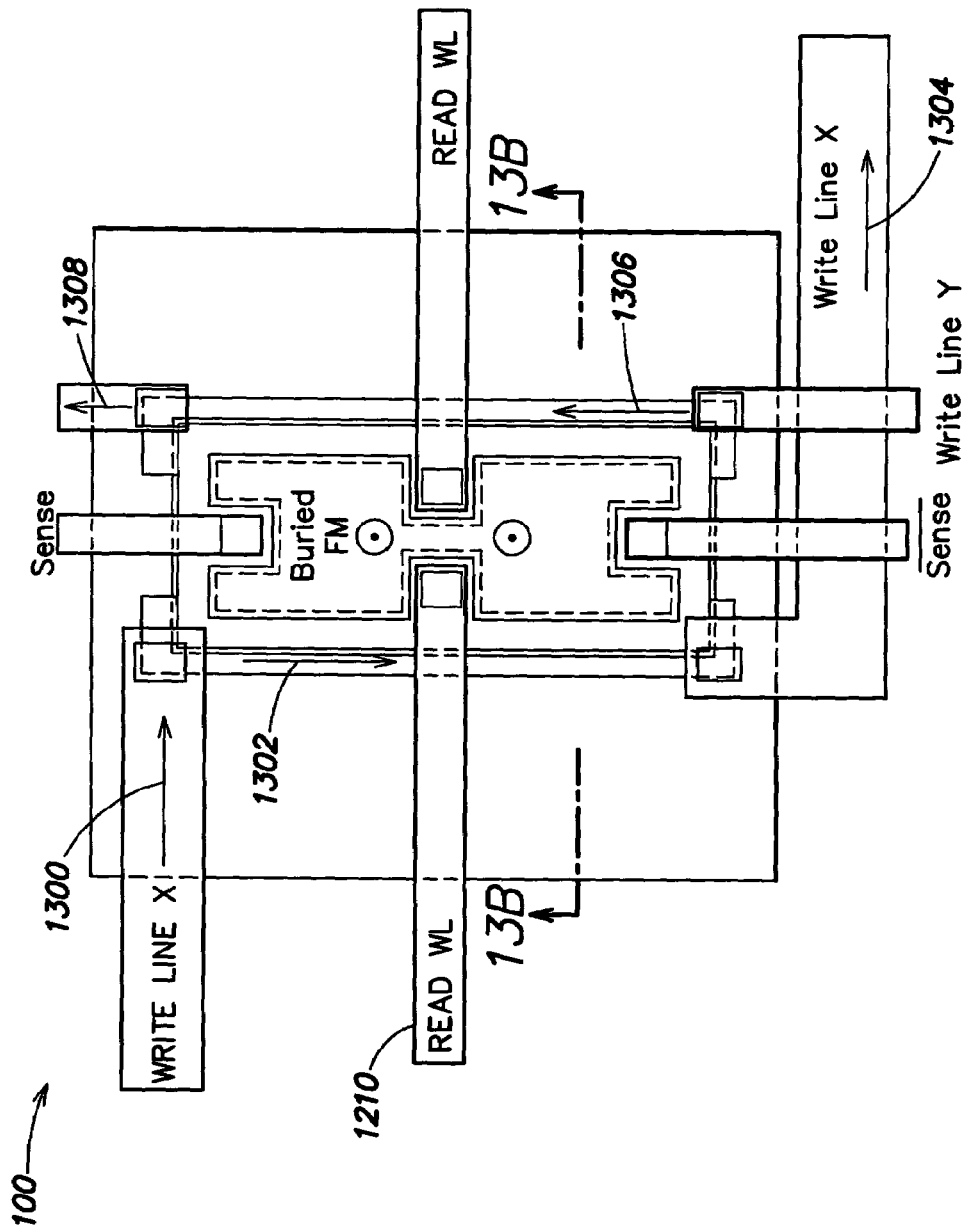
FIGS. 13A-B illustrate respective top and cross-sectional side views of a ferromagnetic memory cell to which a value of a high logic state is written in accordance with an embodiment of the present invention.
Figure 13B:
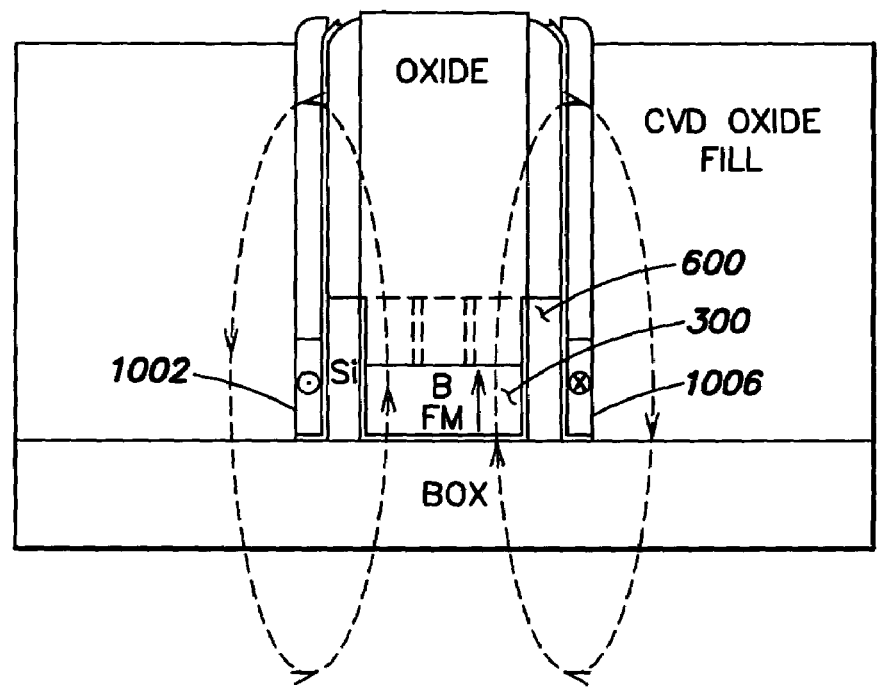
Figure 14:
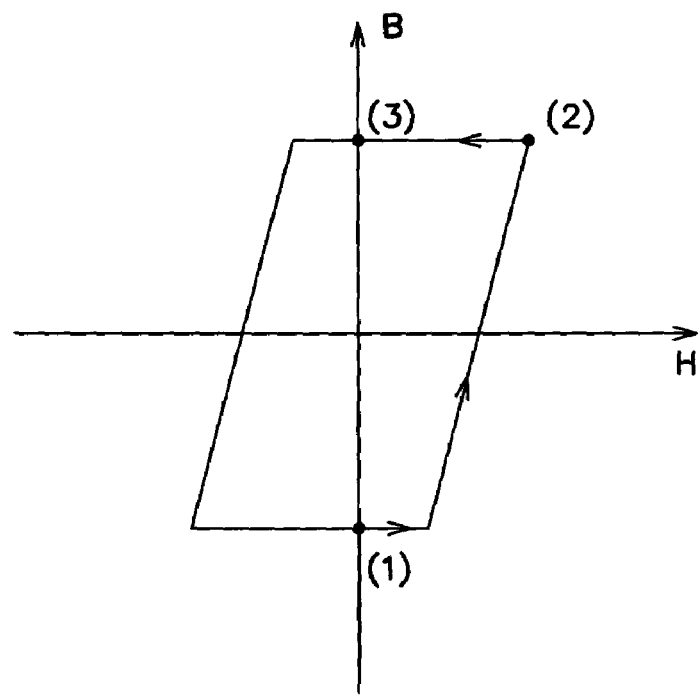
FIG. 14 illustrates a hysteresis loop associated with writing a high logic state to the memory cell in accordance with an embodiment of the present invention.

FIGS. 13A-B illustrate respective top and cross-sectional side views of a ferromagnetic memory cell to which a value of a high logic state (e.g., a logic "1") is written and FIG. 14 illustrates a hysteresis loop associated with writing the high logic state to the memory cell in accordance with an embodiment of the present invention. With reference to FIGS. 13A-14, to write a value of a high logic state in the ferromagnetic memory cell 100, a magnetic field B of a first orientation (e.g., an upward orientation) should be formed in the ferromagnetic layer 300. To establish a magnetic field B of such orientation in the ferromagnetic layer 300, a first current may be provided by the first write word line write line x in a first direction shown by the arrows 1300-1304 through the first conductor 1002, which may serve as a first programming line, and a second current may be provided by the second write word line write line y in a second direction shown by the arrows 1306-1308 through the second conductor 1006, which may serve as a second programming line. It should be noted that both the write word lines, write line x and write line y, are driven to update (e.g., write) a value to the cell 100. More specifically, to flip a state of a value previously-stored by the memory cell 100, a current (provided by the first write word line write line x) through the first conductor 1002 should be in a direction opposite the current (provided by the second write word line write line y) through the second conductor 1006. During a write operation, the read word line read wl and the first and second read terminals sense, /sense may be inactive. More specifically, during a write operation, the read word line read wl may not provide a current to the semiconductor fin enclosure 600, and therefore, a voltage may not develop across the first and second read terminals sense, /sense.

As shown in FIG. 13B, when current is driven in opposite directions through opposing write conductors (e.g., the first and second conductors 1002, 1006), a strong magnetic field (e.g., a vertical field) may be induced through the ferromagnetic layer 300. As shown by the right-hand rule, magnetic fields caused by each programming conductor (e.g., the first and second conductors 1002, 1006) may reinforce each other in the ferromagnetic layer 300.

The hysteresis loop illustrates the relationship between the magnetic field B and magnetic field strength H, which is related to respective currents provided through the first and second conductors 1002, 1006. State (1) illustrates the orientation of the magnetic field B before current is provided to the first and second conductors 1002, 1006. The programming currents provided to the first and second conductors 1002, 1006 may create a magnetic field strength (H) that serves as a driving force strong enough to flip the orientation of the magnetic field B in the ferromagnetic layer 300 to that indicated by state (2). When the programming currents are returned to zero, the orientation of the remnant magnetic field B is that indicated by state (3). Therefore, when the programming currents are returned to zero, the magnetic field B in the ferromagnetic layer 300 maintains its flipped orientation.

Write "0"

Figure 15:
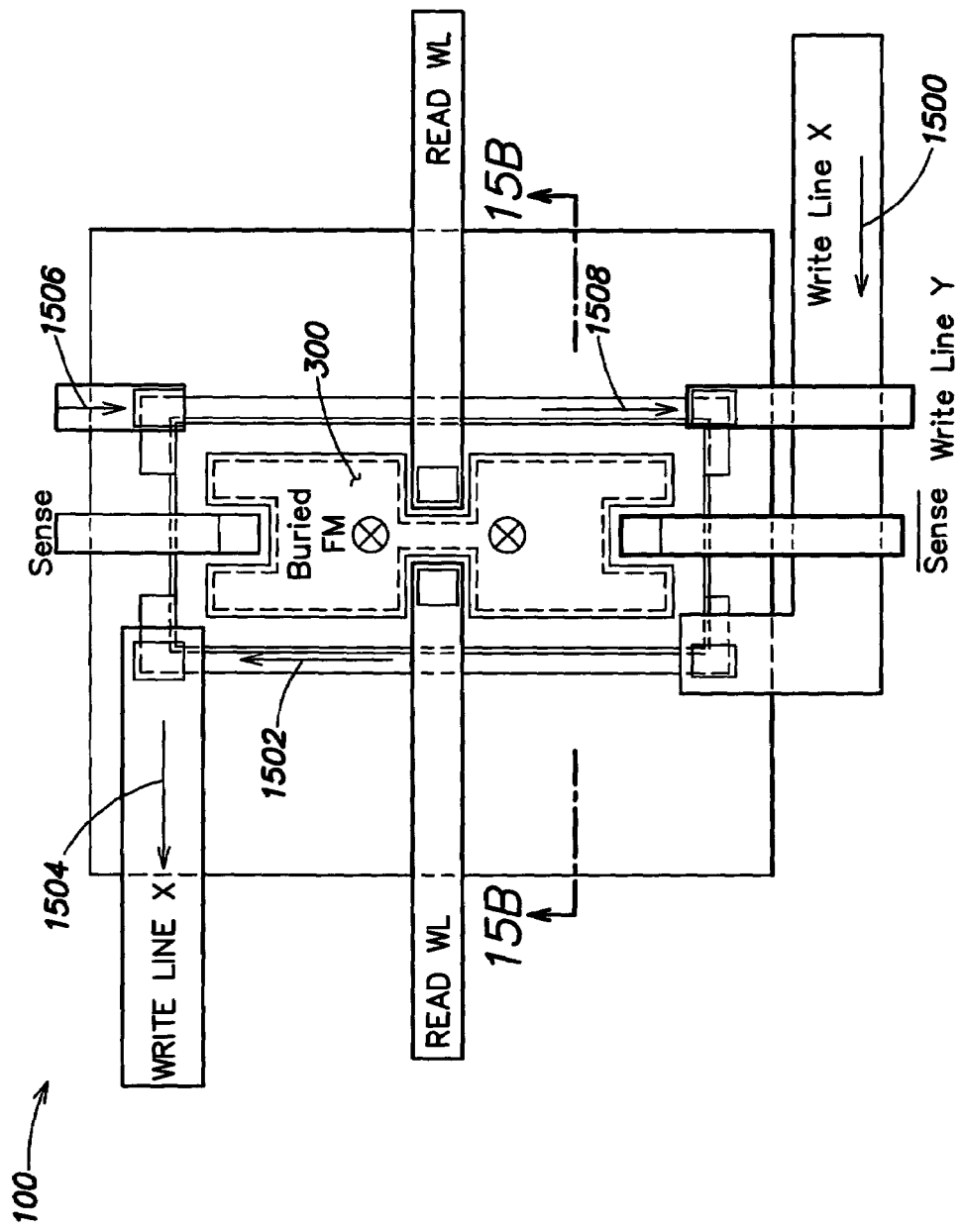
FIG. 15 illustrates a top view of a ferromagnetic memory cell to which a value of a low logic state is written in accordance with an embodiment of the present invention.

FIG. 15 illustrates a top view of a ferromagnetic memory cell 100 to which a value of a low logic state (e.g., a logic "0") is written in accordance with an embodiment of the present invention. With reference to FIG. 15, to write a value of a low logic state in the ferromagnetic memory cell 100, a magnetic field B of a second orientation (e.g., a downward orientation) should be formed in the ferromagnetic layer 300. To establish a magnetic field B of such orientation in the ferromagnetic layer 300, directions of the programming currents are reversed compared to those employed to write a value of a high logic state in the memory cell 100. More specifically, the first current may be provided by the first write word line write line x in a first direction shown by the arrows 1500-1504 through the first conductor 1002 and a second current may be provided by the second write word line write line y in a second direction shown by the arrows 1506-1508 through the second conductor 1006.

Figure 16A:
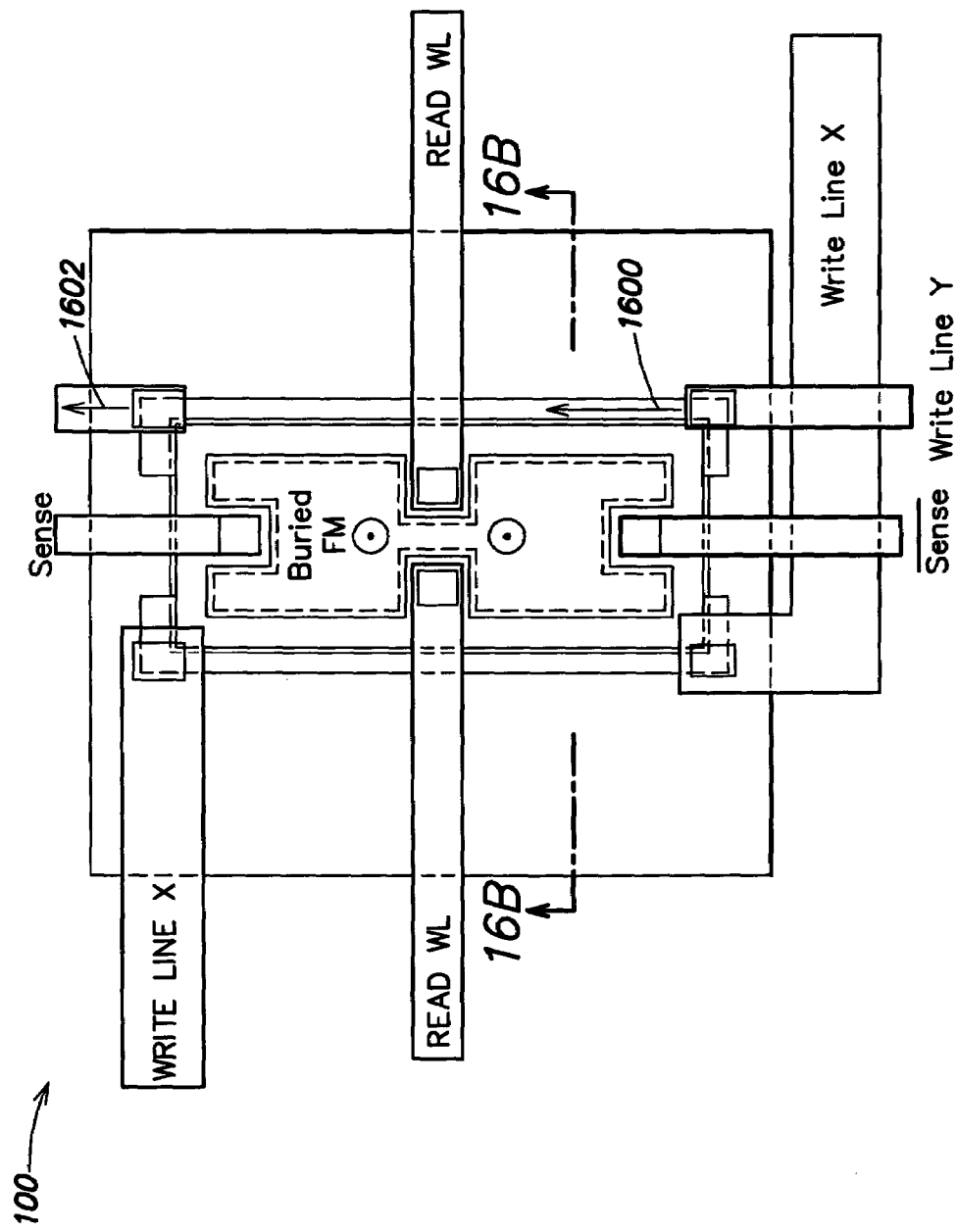
FIGS. 16A-B illustrate respective top and cross-sectional side views of an unselected ferromagnetic memory cell in the same column as ferromagnetic memory cell selected to be written in accordance with an embodiment of the present invention.
Figure 16B:
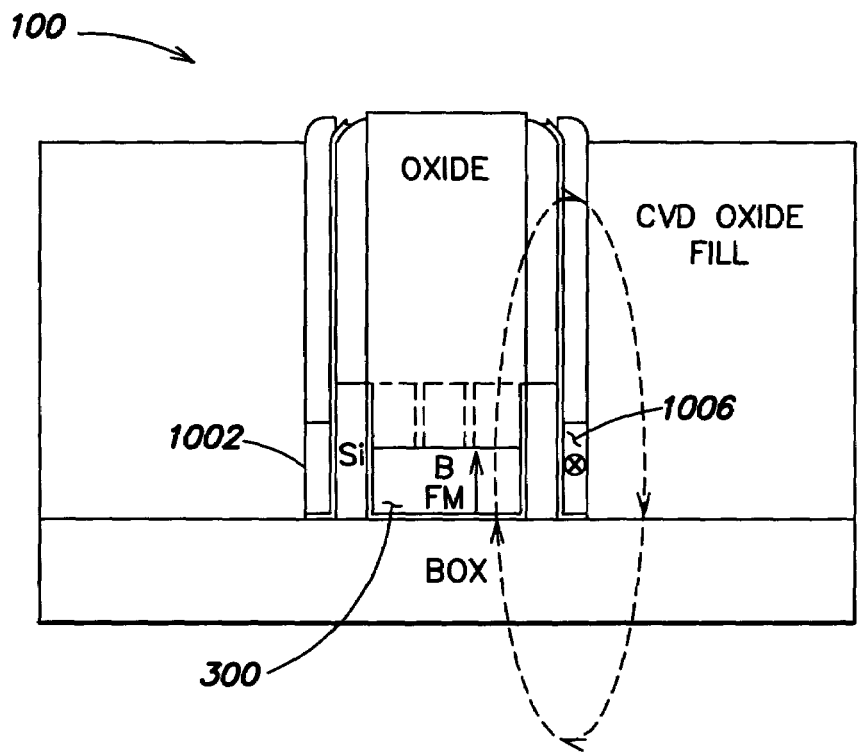
Figure 17:
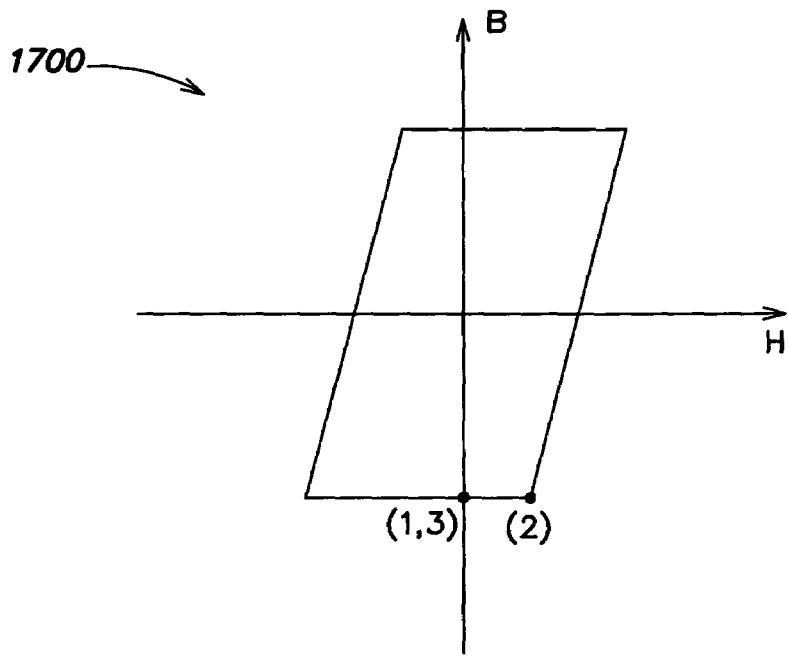
FIG. 17 illustrates a hysteresis loop associated with the unselected ferromagnetic memory cell of FIG. 16 in accordance with an embodiment of the present invention.

As stated to update a value stored in (e.g., to write to) a memory cell 100, both the write word lines write line x, write line y are driven. However, while writing data to a selected memory cell 100 of an array (described below with reference to FIG. 19), a single write word line of one or more unselected cells 100 in the array may be driven. FIGS. 16A-B illustrate respective top and cross-sectional side views of an unselected ferromagnetic memory cell 100 in the same column as the ferromagnetic memory cell 100 selected to be to written and FIG. 17 illustrates a hysteresis loop associated with the unselected ferromagnetic memory cell 100 of FIG. 16 in accordance with an embodiment of the present invention. With reference to FIGS. 16A-17, it is assumed that the unselected cell 100 stores (e.g., initially) a value of a low logic state (although the unselected cell 100 may initially store a different value). During a read or write operation to the selected cell 100 of the memory array, current may be driven through a single write word line write line x, write line y of the unselected cell 100. For example, current may be provided by the second write word line write line y in a direction shown by the arrows 1600-1602 through the second conductor 1006.

As shown in FIG. 16B, when current is driven through the second conductor 1006 as described above, a magnetic field (e.g., a vertical field) B may be induced through the ferromagnetic layer 300. However, such magnetic field B may not be strong enough to update the value stored by the unselected cell 100. The magnetic field B caused by current through a single conductor 1002, 1006 may not be strong enough to flip a state of a value previously stored by the unselected memory cell 100.

The hysteresis loop 1700 illustrates the relationship between the magnetic field B and magnetic field strength H, which is related to respective currents provided through the first and second conductors 1002, 1006 of the unselected cell 100. State (1) illustrates the orientation of the magnetic field B before current is provided to a single conductor (e.g., the second conductor 1006). The programming current provided to the single conductor (e.g., the second conductor 1006) may create a magnetic field strength (H) that serves as a driving force. However, the driving force is not strong enough to flip the orientation of the magnetic field B in the ferromagnetic layer 300. Therefore, the orientation of the magnetic field B remains the same as that before current was provided to the single conductor (as indicated by state (2)). Thereafter, when the programming current is returned to zero, the orientation of the remnant magnetic field B is that indicated by state (3). Therefore, when the programming current is returned to zero, the magnetic field B in the ferromagnetic layer 300 maintains its orientation before current was provided to the single conductor (e.g., remains unchanged).

Read "1" or Read "0"

Figure 18A:
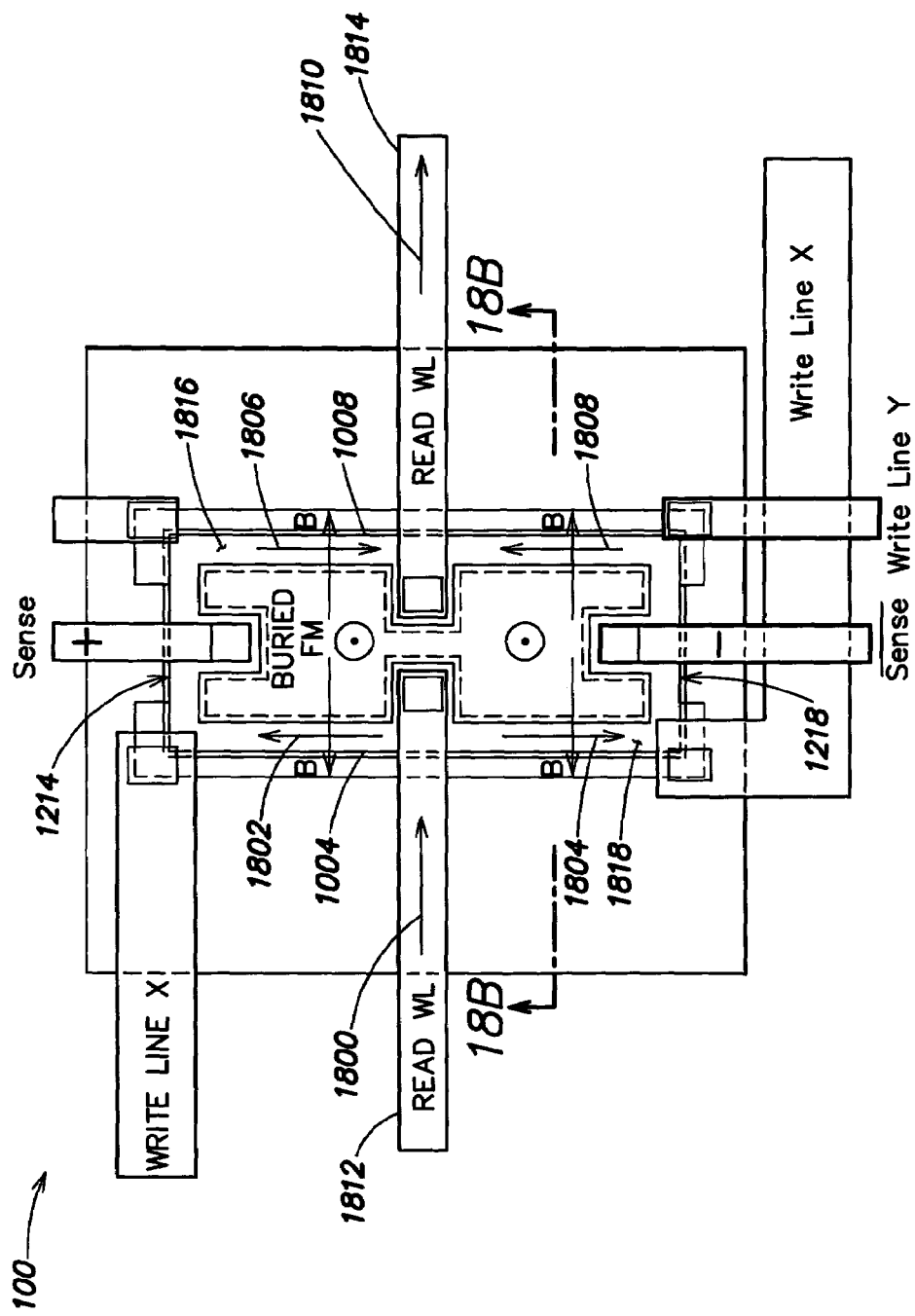
FIGS. 18A-B illustrate respective top and cross-sectional side views of a ferromagnetic memory cell from which a stored value is read in accordance with an embodiment of the present invention.
Figure 18B:
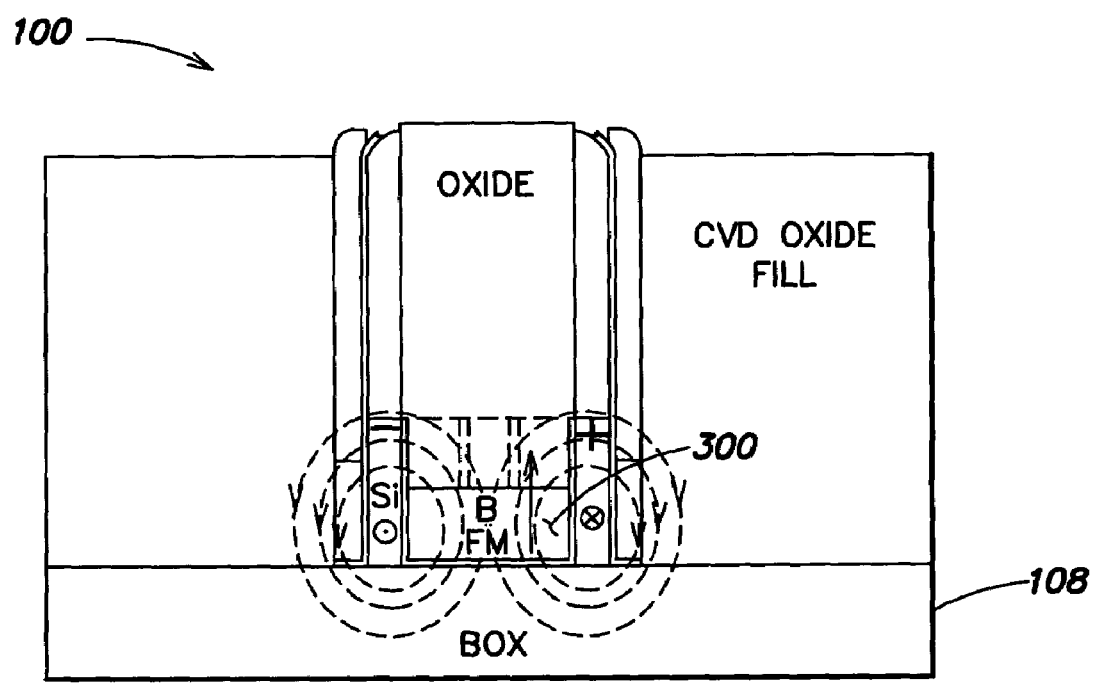

FIGS. 18A-B illustrate respective top and cross-sectional side views of a ferromagnetic memory cell from which a stored value is read in accordance with an embodiment of the present invention. With reference to FIGS. 18A-B, to read data from the cell 100, a current may be provided by a first portion 1812 of the read word line read wl in a direction shown by the arrows 1800-1810 through the semiconductor fin enclosure 600. The read word line read wl may be selectively driven. More specifically, current provided to the first side 1004 of the semiconductor fin enclosure 600 may split in the direction shown by arrows 1802-1804. The current may be provided through the third and fourth sides 1214, 1218, then through the second side 1008 of the semiconductor fin enclosure 600, and through a second portion 1814 of the read word line read wl. In this manner, the read operation may involve forcing a current into the middle of one side (e.g., the first side 1004) of the rectangular fin enclosure 600 and out of the middle of the opposing side (e.g., the second side 1008) of the semiconductor fin enclosure 600. Consequently, the current entering the silicon fin enclosure 600 may split as the current enters the semiconductor fin enclosure 600 and recombine as it exits the semiconductor fin enclosure 600. It should be noted that the current through each side 1004, 1008, 1214, 1218 of the semiconductor fin enclosure 600 may be in a direction which is longitudinal to the axis of the side 1004, 1008, 1214, 1218, respectively.

The orientation of a magnetic field B (e.g., remnant magnetic field) in the ferromagnetic layer 300 may indicate a value stored by the cell 100. It is assumed the orientation of such magnetic field B is substantially vertical (although a different magnetic field orientation may be employed). Because a top surface of the ferromagnetic layer 300 is below a top surface of the semiconductor fin enclosure 600, the substantially vertically oriented remnant magnetic field B from the ferromagnetic layer 300 may produce a fringe magnetic field which crosses through the semiconductor fin enclosure 600 (e.g., the first and second sides 1004 and 1008 thereof) transverse to the direction of the current provided through the semiconductor fin enclosure 600. Consequently, due to Lorentz force, a vector cross-product of the current and the magnetic field B in some portions of the semiconductor fin enclosure 600 is in a direction to drive positive charges in a first direction (e.g., upward) and in other portions of the semiconductor fin enclosure 600 is in a direction to drive positive charges in a second direction (e.g., downward). For example, due to Lorentz force, positive charge carriers (e.g., holes) in a first portion 1816 (e.g., an upper portion) of the semiconductor fin enclosure 600 may be driven in a first direction (e.g., towards the upper surface of the semiconductor fin enclosure 600) and negative charge carriers (e.g., electrons) in the first portion 1816 may be driven in a second direction (e.g., towards the BOX layer 108). Similarly, due to Lorentz force, positive charge carriers (e.g., holes) in a second portion 1818 (e.g., a lower portion) of the semiconductor fin enclosure 600 may be driven in the second direction (e.g., towards the BOX layer 108) and negative charge carriers (e.g., electrons) in the second portion 1818 may be driven in the first direction (e.g., towards the upper surface of the semiconductor fin enclosure 600). Therefore, a voltage gradient may be established in the semiconductor fin enclosure 600. For example, the upper surface of the semiconductor fin enclosure 600 in the first portion 1816 may have a net positive charge, and the upper surface of the semiconductor fin enclosure 600 in the second portion 1818 may have a net negative charge. Consequently, a positive charge may form on the first read terminal sense, which is coupled to the first portion 1816 of the semiconductor fin enclosure 600, and a negative charge may form on the second read terminal /sense, which is coupled to the second portion 1818 of the semiconductor fin enclosure 600. In this manner, a voltage (e.g., differential voltage) may be induced or formed across the first and second read terminals sense, /sense. The voltage may indicate a value stored by the cell 100, and therefore, read from the cell 100. The above charges formed in portions 1816, 1818 of the semiconductor fin enclosure 600 and/or formed on the first and second read terminals sense, /sense are exemplary. Therefore, different charges may be employed. Further, although the orientation of the magnetic field B is in a first direction (e.g., upward) in the example above, the orientation of the magnetic field B may be different (e.g., downward) such that a different voltage is induced across the read terminals sense, /sense, and therefore, read from the cell 100.

Figure 19:
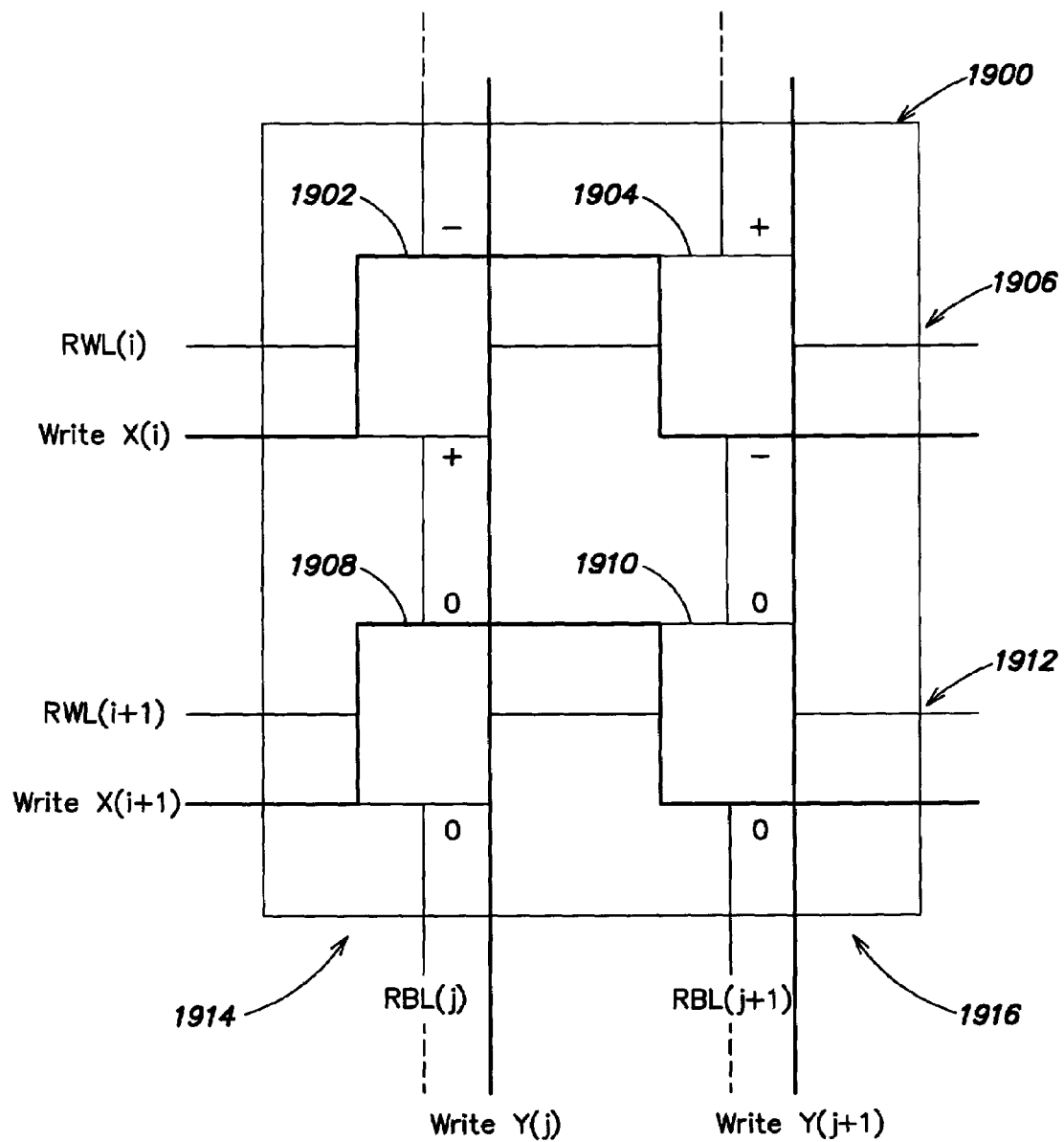
FIG. 19 is a block diagram of an array of ferromagnetic memory cells in accordance with an embodiment of the present invention.

FIG. 19 is a block diagram of an array of ferromagnetic memory cells in accordance with an embodiment of the present invention. With reference to FIG. 19, the array 1900 may include a first cell 1902 coupled to a second cell 1904 in the same row 1906 as the first cell 1902. Further, the array 1900 may include a third cell 1908 coupled to a fourth cell 1910 in the same row 1912 as the third cell 1908. The third cell 1908 may be coupled to the first cell 1902 in the same column 1914 as the first cell 1902, and the fourth cell 1910 may be coupled to the second cell 1904 in the same column 1916 as the second cell 1904. Each of the cells 1902, 1904, 1908, 1910 may be the ferromagnetic cell 100 in accordance with an embodiment of the present invention described above.

A first write word line RWL(i) may couple to the first and second cells 1902, 1904 and serve as the first write word line write line x for such cells 1902, 1904. Similarly, a second write word line RWL(i+1) may couple to the third and fourth cells 1908, 1910 and serve as the first write word line write line x for such cells 1908, 1910. A third write word line WRITE Y(j) may couple to the first and third cells 1902, 1908 and serve as a second write word line write line y for such cells 1902, 1908. Similarly, a fourth write word line WRITE Y(j+1) may couple to the second and fourth cells 1904, 1910 and serve as a second write word line write line y for such cells 1904, 1910.

A first read word line RWL(i) may couple to the first and second cells 1902, 1904 and serve as the read word line read wl for such cells 1902, 1904. Similarly, a second read word line RWL(i+1) may couple to the third and fourth cells 1908, 1910 and serve as the read word line read wl for such cells 1908, 1910. A first line RBL(j) adapted to read a voltage induced across a cell 1902, 1908 in a first column 1914 may be coupled to the first and third cells 1902, 1908. For example, read terminals sense, /sense of such cells 1902, 1908 may be coupled in series to the first line RBL(j). Similarly, a second line RBL(j+1) adapted to read a voltage induced across a cell 1904, 1910 in a second column 1916 may be coupled to the second and fourth cells 1904, 1910. For example, read terminals sense, /sense of such cells 1904, 1910 may be coupled in series to the second line RBL(j+1). The configuration of the memory array 1900 described above is exemplary. Therefore, the memory array 1900 may include a larger or smaller number of cells 100. Further, the cells 100 in the memory array 1900 and/or wiring (e.g., write and/or read word lines) coupled thereto may be arranged in a different manner.

In operation, to write data to a cell 1902, 1904, 1908, 1910 in the memory array 1900, currents may be driven in the write word lines corresponding to the cell 1902, 1904, 1908, 1910. For example, to write a value to the first cell 1902, a first current may be provided to the first cell 1902 in a first direction by the first write word line WRITE X(i), and a second current (e.g., in a direction opposite the first current) may be provided to the cell 1902 by the second write word line WRITE Y(j). Data may be written to other cells 1902, 1904, 1908, 1910 of the array 1900 in a similar manner.

In some embodiments, data may be read from an entire row 1906, 1912 of cells 1902, 1904, 1908, 1910 at a time (although data may be read from a single cell at a time). More specifically, a whole row 1906, 1912 may be read out during a single read operation by driving a current through the read word line RWL(i), RWL(i+1) corresponding to the row 1906, 1912, and sensing the voltage induced across each cell 1902 and 1904, 1908 and 1910 in the row 1906, 1912 using the lines RBL(j), RBL(j+1) adapted to read such induced voltage corresponding to such cells 1902, 1908, 1904, 1910. For example, if read word line RWL(i) is employed to provide a current to cells 1902, 1904 in the first row 1906, a voltage (e.g., Hall effect voltage) may be induced across each of the first and second cells 1902, 1904. Because the second read word line RWL(i+1) is not employed to provide a current to third and fourth cells 1908, 1910 in the second row 1912, no voltage is induced across such cells 1908, 1910. Therefore, the voltage sensed at the first line RBL(j) adapted to read an induced voltage across a cell is the voltage induced across the first cell 1902, and the voltage sensed at the second line RBL(j+1) adapted to read an induced voltage across a cell is the voltage induced across the second cell 1904. Data may be read from remaining cells 1902, 1904, 1908, 1910 of the array 1900 in a similar manner.

The foregoing description discloses only exemplary embodiments of the invention. Modifications of the above disclosed apparatus and methods which fall within the scope of the invention will be readily apparent to those of ordinary skill in the art. For instance, in some embodiments, the semiconductor fin enclosure 600 may comprise silicon and the first and second conductors 1002, 1006 may comprise tungsten. However, the semiconductor fin enclosure 600, first conductor 1002 and/or second conductor 1006 may comprise a different and/or additional material. Although the semiconductor fin enclosure 600 is substantially rectangular shaped, in other embodiments, the semiconductor fin enclosure 600 may shaped differently (e.g., may have any polygonal shape).

Accordingly, while the present invention has been disclosed in connection with exemplary embodiments thereof, it should be understood that other embodiments may fall within the spirit and scope of the invention, as defined by the following claims.

The invention claimed is:

1. A memory cell, comprising:
   a semiconductor fin enclosure formed on an insulating layer of a substrate; and
   a ferromagnetic material within the semiconductor fin enclosure;
   wherein a top surface of the ferromagnetic material is below a top surface of the semiconductor fin enclosure.

2. The memory cell of claim 1 wherein the semiconductor fin enclosure includes a first side opposite a second side and a third side opposite a fourth side; and
   further comprising:
   a first conductor formed along the first side; and
   a second conductor formed along the second side;
   wherein the memory cell is adapted to update a magnetic field through the ferromagnetic material, which indicates a value stored by the cell, based on respective currents through the first and second conductors, thereby writing a value to the cell.

3. The memory cell of claim 2 further comprising:
   a first write word line coupled to the first conductor and adapted to provide a first current through the first conductor; and
   a second write word line coupled to the second conductor and adapted to provide a second current through the second conductor.

4. The memory cell of claim 2 wherein the memory cell is further adapted to update the magnetic field through the ferromagnetic material based on a first current in a first direction through the first conductor and a second current in an opposite direction through the second conductor.

5. The memory cell of claim 2 further comprising a first read terminal coupled to the third side and a second read terminal coupled to the fourth side;
   wherein the memory cell is adapted to:
   develop a first charge on the first read terminal based on a remnant magnetic field through the ferromagnetic material and a current through the semiconductor fin enclosure; and
   develop a second charge on the second read terminal based on the remnant magnetic field through the ferromagnetic material and the current through the semiconductor fin enclosure;
   wherein the first and second charges indicate a value stored by the cell.

6. The memory cell of claim 5 further comprising a read word line coupled to the first and second sides of the semiconductor fin enclosure and adapted to provide the current to the semiconductor fin enclosure.

7. The memory cell of claim 5 wherein the ferromagnetic material is adapted to force the remnant magnetic field through the semiconductor fin enclosure in a direction transverse to current through the semiconductor fin enclosure.

8. A method, comprising:
   forming a semiconductor fin enclosure on an insulating layer of a substrate; and
   forming a ferromagnetic material within the semiconductor fin enclosure, thereby forming a memory cell;
   wherein a top surface of the ferromagnetic material is below a top surface of the semiconductor fin enclosure.

9. The method of claim 8 wherein the semiconductor fin enclosure includes a first side opposite a second side and a third side opposite a fourth side; and further comprising:
   forming a first conductor along the first side;
   forming a second conductor along the second side; and
   updating a magnetic field through the ferromagnetic material, which indicates a value stored by the cell, based on respective currents through the first and second conductors, thereby writing a value to the cell.

10. The method of claim 9 further comprising:
forming a first write word line coupled to the first conductor;
forming a second write word line coupled to the second conductor;
employing the first write word line to provide a first current through the first conductor; and
employing the second write word line to provide a second current through the second conductor.

11. The method of claim 10 wherein:
forming the first write word line includes selectively etching one or more portions of a nitride spacer above the first conductor; and
forming the second write word line includes selectively etching one or more portions of a nitride spacer above the second conductor.

12. The method of claim 9 wherein updating the magnetic field through the ferromagnetic material based on respective currents through the first and second conductors includes updating the magnetic field through the ferromagnetic material based on a first current in a first direction through the first conductor and a second current in an opposite direction through the second conductor.

13. The method of claim 9 further comprising:
forming a first read terminal coupled to the third side and a second read terminal coupled to the fourth side;
developing a first charge on the first read terminal based on a remnant magnetic field through the ferromagnetic material and a current through the semiconductor fin enclosure; and
developing a second charge on the second read terminal based on the remnant magnetic field through the ferromagnetic material and the current through the semiconductor fin enclosure;
wherein the first and second charges indicate a value stored by the cell.

14. The method of claim 13 wherein developing a first charge on the first read terminal and developing a second charge on the second read terminal includes forcing the remnant magnetic field through the semiconductor fin enclosure in a direction transverse to current through the semiconductor fin enclosure.

15. The method of claim 13 further comprising:
forming a read word line coupled to the first and second sides of the semiconductor fin enclosure; and
providing the current to semiconductor fin enclosure using the read word line.

16. The method of claim 15 wherein:
forming the read word line includes:
   selectively etching one or more portions of an oxide spacer above the first side of the semiconductor fin enclosure; and
   selectively etching one or more portions of an oxide spacer above the second side of the semiconductor fin enclosure;
   forming the first read terminal includes selectively etching one or more portions of an oxide spacer above the third side of the semiconductor fin enclosure; and
   forming the second read terminal includes selectively etching one or more portions of an oxide spacer above the fourth side of the semiconductor fin enclosure.

17. A system, comprising:
a first memory cell;
a second memory cell coupled to the first memory cell in the same row as the first memory cell; and
a third memory cell coupled to the first memory cell in the same column as the first memory cell;
wherein each cell includes:
   a semiconductor fin enclosure formed on an insulating layer of a substrate; and
   a ferromagnetic material within the semiconductor fin enclosure, wherein a top surface of the ferromagnetic material is below a top surface of the semiconductor fin enclosure.

18. The system of claim 17 wherein:
the semiconductor fin enclosure of each cell includes a first side opposite a second side and a third side opposite a fourth side;
each cell further comprises:
   a first conductor formed along the first side; and
   a second conductor formed along the second side; and
each cell is adapted to update a magnetic field through the ferromagnetic material, which indicates a value stored by the cell, based on respective currents through the first and second conductors, thereby writing a value to the cell.

19. The system of claim 18 wherein:
each cell includes:
   a first write word line coupled to the first conductor and adapted to provide a first current through the first conductor; and
   a second write word line coupled to the second conductor and adapted to provide a second current through the second conductor;
the first write word line of the first cell is coupled to the first write word line of the second cell; and
the second write word line of the first cell is coupled to the second write word line of the third cell.

20. The system of claim 17 wherein:
each cell includes:
   a first read terminal coupled to the third side and a second read terminal coupled to the fourth side; and
   a read word line coupled to the first and second sides of the semiconductor fin enclosure and adapted to provide the current to semiconductor fin enclosure;
each cell is adapted to:
   develop a first charge on the first read terminal based on a remnant magnetic field through the ferromagnetic material and the current through the semiconductor fin enclosure; and
   develop a second charge on the second read terminal based on the remnant magnetic field through the ferromagnetic material and the current through the semiconductor fin enclosure, wherein the first and second charges indicate a value stored by the cell; and
the read word line of the first cell is coupled to the read word line of the second cell.

* * * * *